United States Patent [19]

Chin et al.

[11] Patent Number: 5,661,675
[45] Date of Patent: Aug. 26, 1997

[54] POSITIVE FEEDBACK CIRCUIT FOR FAST DOMINO LOGIC

[75] Inventors: Kai J. Chin; Sudarshan Kumar, both of Fremont, Calif.

[73] Assignee: Intel Corporation, Santa Clara, Calif.

[21] Appl. No.: 414,908

[22] Filed: Mar. 31, 1995

[51] Int. Cl.[6] .................................. G06F 7/50; H03K 17/80
[52] U.S. Cl. .......................... 364/768; 364/715.011; 307/407; 326/34; 326/93; 326/95; 326/98; 327/211; 327/212
[58] Field of Search .......................... 364/715.01, 768; 326/31, 34, 93, 94–98; 327/211, 212; 307/443, 448, 451, 452, 480, 481, 246, 263, 407

[56] References Cited

U.S. PATENT DOCUMENTS

| | | | |
|---|---|---|---|
| 5,146,115 | 9/1992 | Benhamida | 307/452 |
| 5,208,489 | 5/1993 | Houston | 307/451 |
| 5,453,708 | 9/1995 | Gupta et al. | 326/98 |
| 5,532,625 | 7/1996 | Rajivan | 326/98 |

*Primary Examiner*—Reba I. Elmore
*Assistant Examiner*—Emmanuel L. Moise
*Attorney, Agent, or Firm*—Blakely, Sokoloff, Taylor & Zafman

[57] ABSTRACT

A logic circuit is described. The logic circuit generates a first signal state in response to a first set of input signals, generates a second signal state in response to a second set of input signals, activates a bypass switch in response to the first signal state, and bypasses a domino logic unit in response to the first signal state.

14 Claims, 17 Drawing Sheets

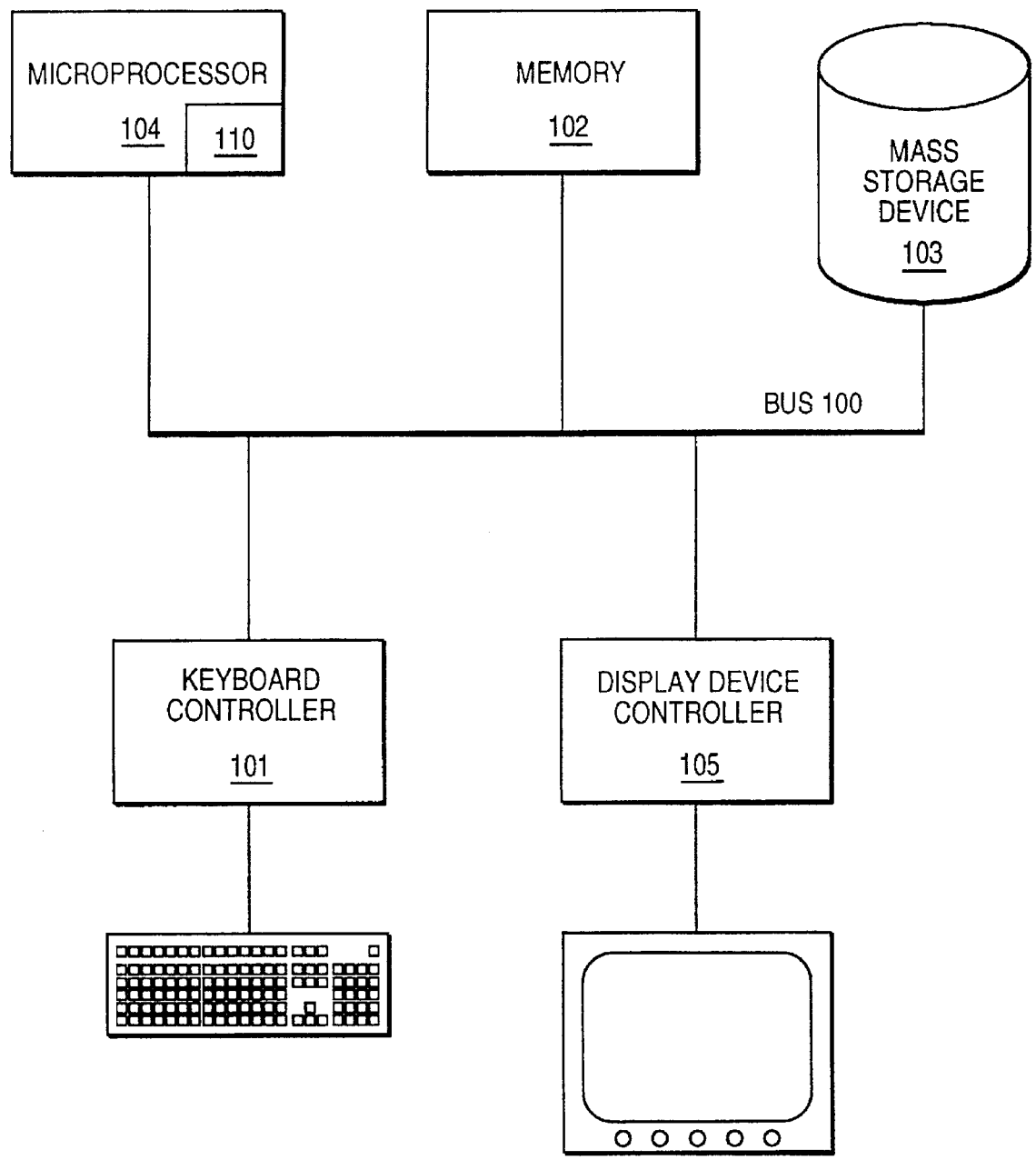
FIG_1

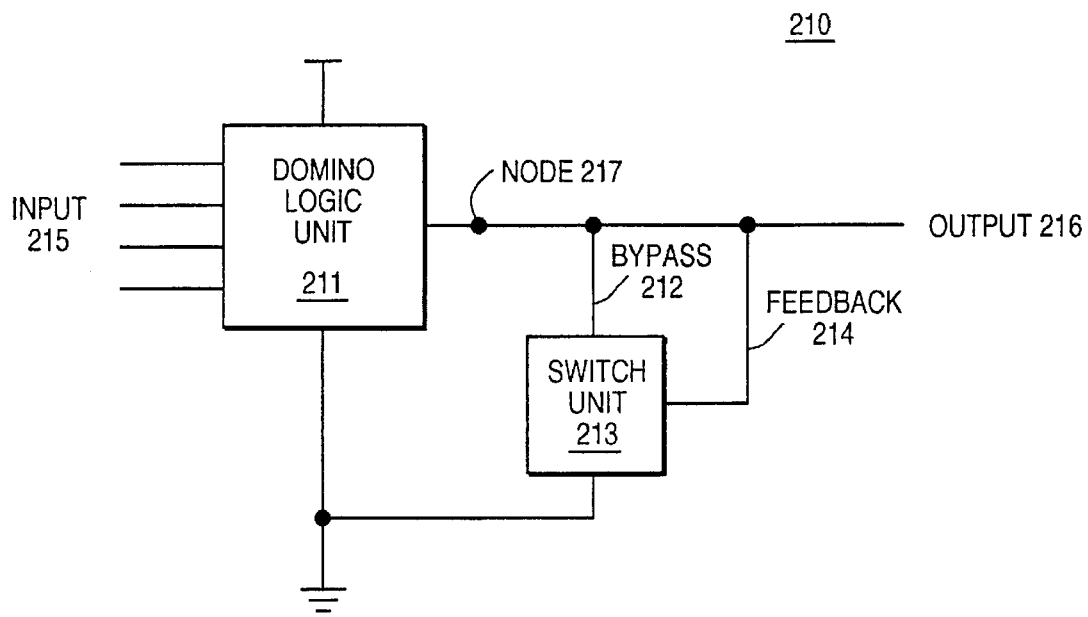
FIG_2
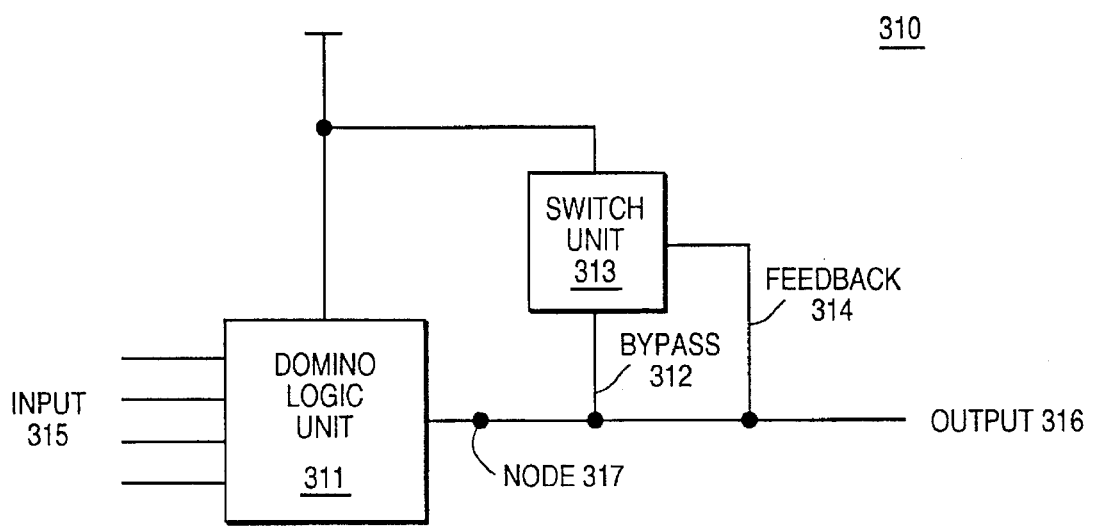
FIG_3

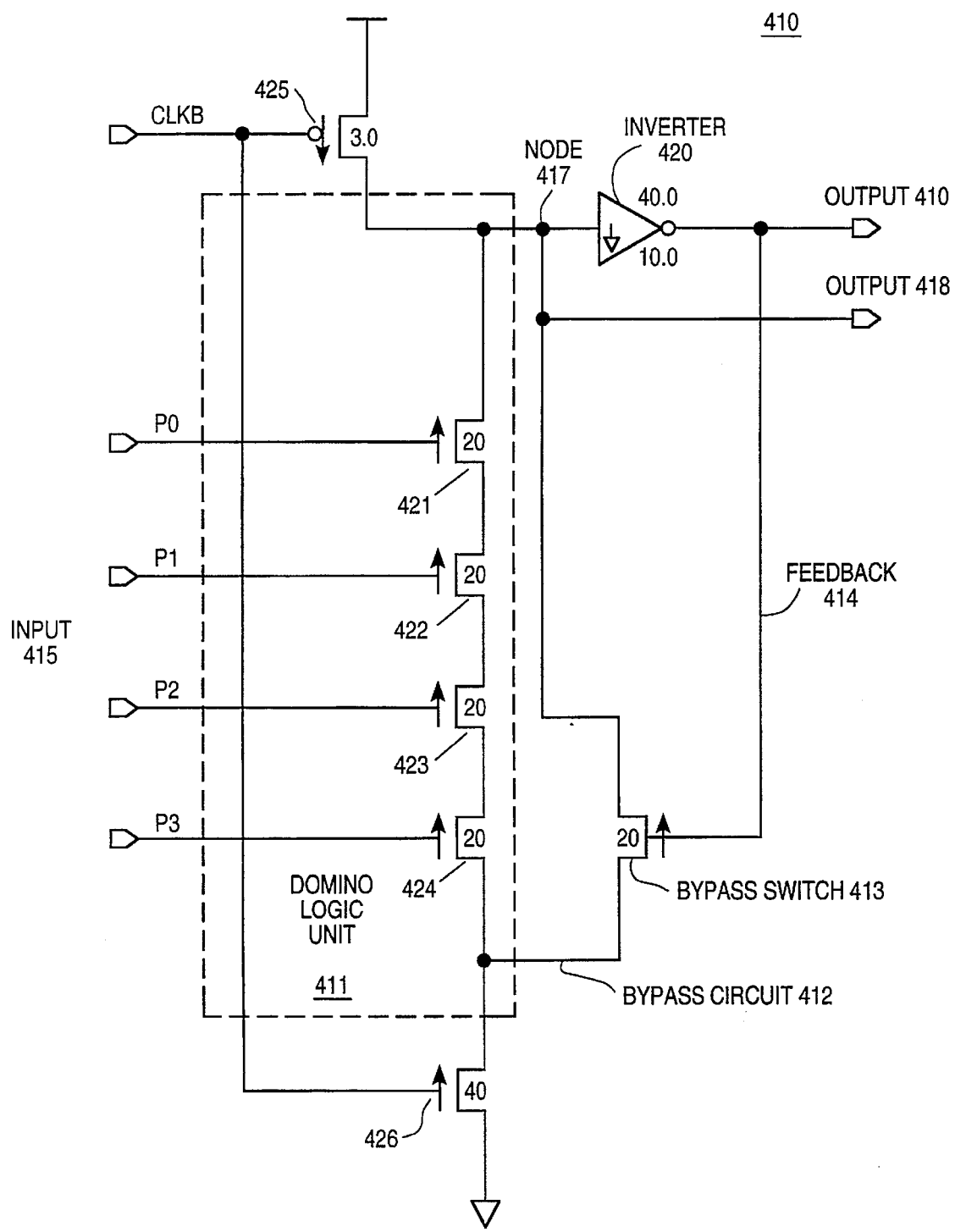
FIG_4

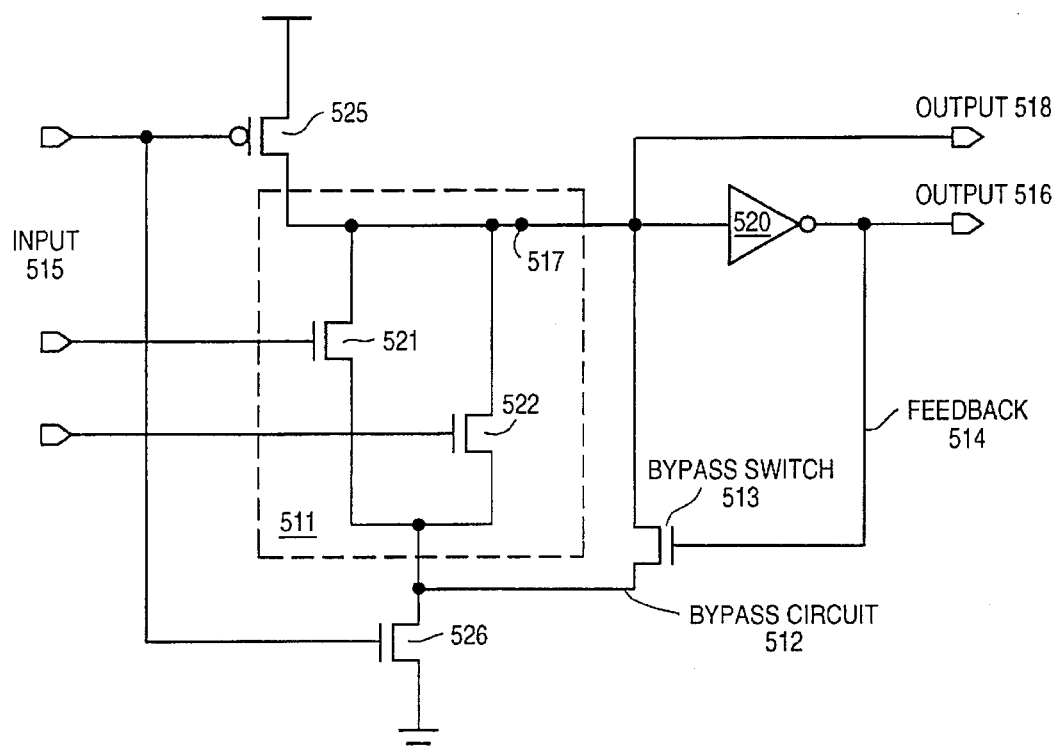
FIG_5
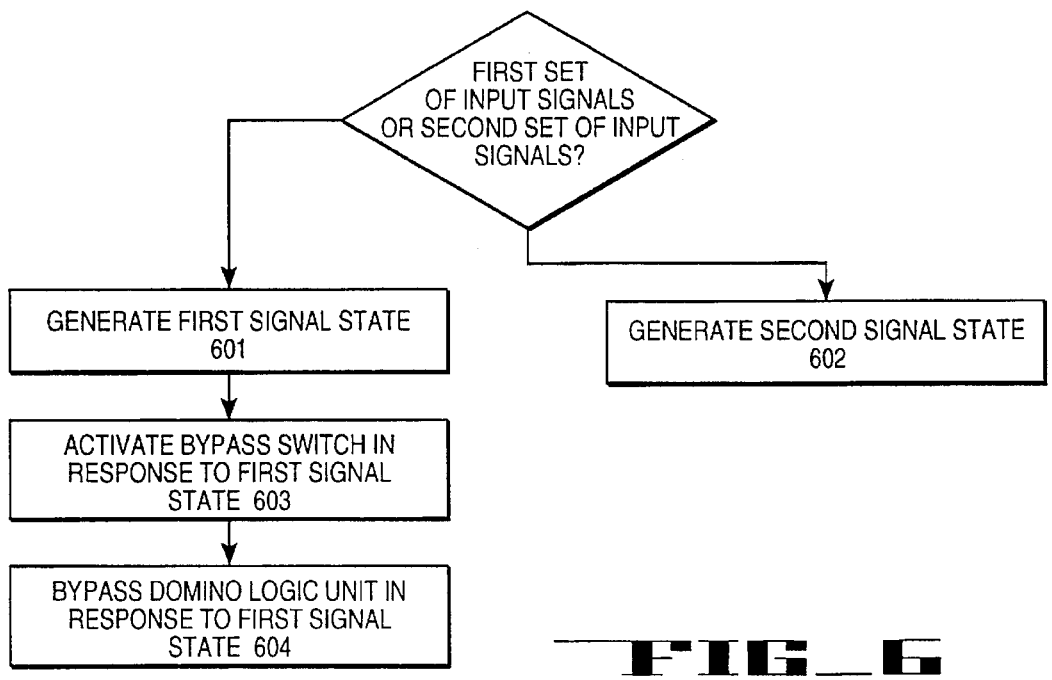
FIG_6

FIG_X

FIG_11

FIG_12

FIG_14

POSITIVE FEEDBACK CIRCUIT FOR FAST DOMINO LOGIC

FIELD OF THE INVENTION

The present invention relates to the design of logic circuits. More particularly, the present invention relates to the design of logic circuit.

BACKGROUND OF THE INVENTION

Microprocessors and other components in computer systems often have logic circuits which allow them to perform logical operations. As performance requirements increase, faster logic circuits are required in the microprocessors and other components to provide the requisite level of performance. One manner of enhancing performance involves reducing the number of gate delays. One prior logic circuit, the domino logic circuit, performs a logical operation in one gate delay. With an AND operation, the domino logic circuit precharges a node to a high potential. The inputs of the domino logic circuit are each coupled to a gate of an n type field effect transistor. The transistors are coupled in series to the node and ground potential. When all of the inputs of the domino logic circuit have a logical-one signal state, thus satisfying the AND condition, all of the n type transistors are in the ON state. A conductive path to ground potential is created and the node discharges from a high potential to a low potential. When one of the inputs of the domino logic circuit has a logical-zero signal state, one of the transistors in series remains in the OFF state. A conductive path to ground potential is not created and the node does not discharge from high potential to low potential. The node instead remains at the high potential. An OR operation can also be implemented in the domino logic circuit by arranging the n type transistors in parallel between the node and ground potential. In this mariner, any input with a logical-one signal state can discharge the node from high potential to ground potential. Other logical operations can also be implemented using combinations of AND and OR operations.

However, with increasing performance requirements of microprocessors and other components, logic circuits with further enhanced performance capabilities are required.

Thus, what is needed is a faster logic circuit.

SUMMARY OF THE INVENTION

A novel logic circuit is described. The logic circuit comprises a domino logic unit for generating a first signal state in response to a first set of input signals and generating a second signal state in response to a second set of input signals, an output coupled to the domino logic unit for outputting an output signal, a bypass circuit coupled to the output for bypassing the domino logic unit, and a bypass switch Coupled to the bypass circuit for controlling the bypass circuit.

Under an alternative embodiment, the bypass switch comprises a n type field effect transistor.

Under another alternative embodiment, the bypass switch is activated when the domino logic unit generates a logical-zero signal state.

Under yet another alternative embodiment, the domino logic unit is a precharged logic circuit.

A method for generating an output signal for a logical operation is also described. The method comprises generating a first signal state in response to a first set of input signals, generating a second signal state in response to a second set of input signals, activating a bypass switch in response to the first signal state, and bypassing a domino logic unit in response to the first signal state.

Under an alternative embodiment, the first set of input signals and the second set of input signals are group propagate signals.

Under another alternative embodiment, the method further comprises precharging the domino logic unit.

Under yet another alternative embodiment, the method further comprises providing the output signal to an adder circuit.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates in block diagram form a computer system of one embodiment of the present invention.

FIG. 2 illustrates in block diagram form a logic circuit of a second embodiment of the present invention.

FIG. 3 illustrates in block diagram form a logic circuit of a third embodiment of the present invention.

FIG. 4 illustrates in circuit diagram form a logic circuit of a fourth embodiment of the present invention.

FIG. 5 illustrates in circuit diagram form a logic circuit of a fifth embodiment of the present invention.

FIG. 6 illustrates in flowchart form the operation of a logic circuit of a sixth embodiment of the present invention.

FIG. 18 illustrates in circuit diagram form a carry generator of a eighteenth embodiment of the present invention.

DETAILED DESCRIPTION

Figure 7:
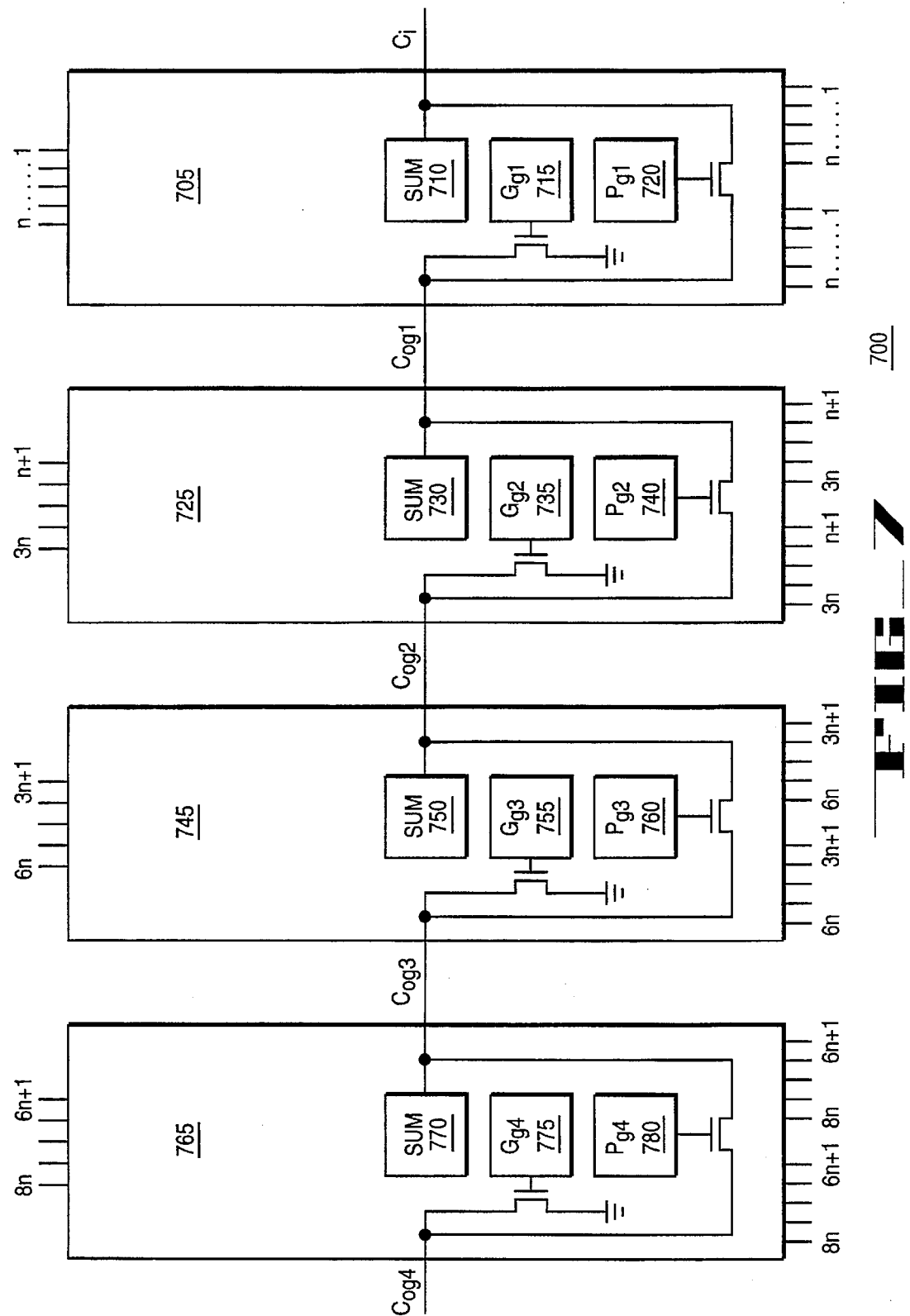
FIG. 7 illustrates in block diagram form an adder of a seventh embodiment of the present invention.

A novel logic circuit is described. In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

FIG. 1 illustrates in block diagram form a computer system of one embodiment of the present invention. The computer system comprises bus 100, keyboard interface 101, external memory 102, mass storage device 103, processor 104 and display device controller 105. Bus 100 is coupled to display device controller 105, keyboard interface 101, processor 104, memory 102 and mass storage device 103. Display device controller 105 can be coupled to a display device. Keyboard controller 101 can be coupled to a keyboard.

Bus 100 can be a single bus or a combination of multiple buses. As an example, bus 100 can comprise an Industry Standard Architectural (ISA) bus, an Extended Industry Standard Architecture (EISA) bus, a system bus, a X-bus, PS/2 bus, a Peripheral Components Interconnect (PCI) bus, a Personal Computer Memory Card International Association (PCMCIA) bus or other buses. Bus 100 can also comprise a combination of any buses. Bus 100 provides communication links between components in the computer system. Keyboard interface 101 can be a keyboard controller or other keyboard interface. Keyboard interface 101 can be a dedicated device or can reside in another device such as a bus controller or other controller. Keyboard interface 101 allows coupling of a keyboard to the computer system and transmits signals from a keyboard to the computer system. External memory 102 can comprise a dynamic random access memory (DRAM) device, a static random access memory (SRAM) device, or other memory devices. External memory 102 stores information and data from mass storage device 103 and processor 104 for use by processor 104. Mass storage device 103 can be a hard disk drive, a floppy disk drive, a CD-ROM device, a flash memory device or other mass storage device. Mass storage device 103 provides information and data to external memory 102.

Processor 104 processes information and data from external memory 102 and stores information and data into external memory 102. Processor 104 also receives signals from keyboard controller 101 and transmits information and data to display device controller 105 for display on a display device. Processor 104 can be a complex instruction set computing (CISC) microprocessor, a reduced instruction set computing (RISC) microprocessor, a very long instruction word (VLIW) microprocessor or other processor device. Display device controller 105 allows coupling of a display device to the computer system and acts as an interface between the display device and the computer system. Display device controller 105 can be a monochrome display adapter (MDA) card, a color graphics adapter (CGA) card, enhanced graphics adapter (EGA) card or other display device controller. The display device can be a television set, a computer monitor, a flat panel display or other display device. The display device receives information and data from processor 104 through display device controller 105 and displays the information and data to the user of the computer system.

Processor 104 has a logic circuit comprising a domino logic unit for generating a first signal state in response to a first set of input signals and generating a second signal state in response to a second set of input signals. The logic circuit also comprises an output coupled to the domino logic unit for outputting an output signal. The logic circuit also comprises a bypass circuit coupled to the output for bypassing the domino logic unit and a bypass switch coupled to the bypass circuit for controlling the bypass circuit. The logic circuit can reside in an adder circuit in processor 104 or other circuit in processor 104. Under an alternative embodiment, the logic circuit can comprise a plurality of inputs coupled to a plurality of propagate signal lines and the output can be coupled to a block propagate signal line.

FIG. 2 illustrates in block diagram form a logic circuit of a second embodiment of the present invention. Logic circuit 210 comprises domino logic unit 211, bypass circuit 212, bypass switch 213, feedback 214, input 215 and output 216. Domino logic unit 211 is coupled to a high voltage potential, ground potential, input 215 and output 216. Bypass circuit 212 is coupled to output 216 on one end and coupled to ground potential on the other end. Bypass circuit 212 is also coupled to bypass switch 213. Bypass switch 213 is coupled to output 216 by feedback 214. Domino logic unit 211 generates a first signal state in response to a first set of input signals and generates a second signal state in response to a second set of input signals. In this manner, domino logic unit 211 performs logical operations on the input signals received through input 215. When the input signals on input 215 satisfy a predetermined condition (e.g. a first set of input signals), domino logic unit 211 generates a first signal state. On the other hand, when the input signals on input 215 do not satisfy the predetermined condition (e.g. a second set of input signals), domino logic unit 211 generates a second signal state. Output 216 outputs an output signal for logic circuit 210. The output signal can be the signal states generated by domino logic 211 or can be corresponding signal states to the signal states generated by domino logic unit 211 e.g. an inversion of the signal states generated by domino logic unit 211.

Domino logic unit 211 generates the first signal state by discharging node 217 to ground potential. Domino logic unit 211 generates a second signal state by maintaining node 217 at a high voltage potential. Bypass circuit 212 provides a bypass path around domino logic unit 211 from node 217 to ground potential. Bypass circuit 212 is controlled by bypass switch 213. When bypass switch 213 is activated, bypass circuit 212 is also activated and bypass circuit 212 provides a bypass path from node 217 to ground potential. When bypass switch 213 is not activated, bypass circuit 212 does not provide the bypass path from node 217 to ground potential.

In this embodiment, when domino logic unit 211 generates a first signal state, the first signal state is provided to switch unit 213 by feedback 214. In response to the first signal state, switch unit 213 is activated and as a result, bypass circuit 212 is also activated. A bypass path is created from node 217 to ground potential. This bypass path provides additional charge carrying capacity and thus allows for faster discharge of node 217 to ground potential. In this manner, the switching speed of domino logic unit 211 is enhanced by bypass circuit 212 and bypass switch 213.

FIG. 3 illustrates in block diagram form a logic circuit of a third embodiment of the present invention. Logic circuit 310 comprises domino logic unit 311, bypass circuit 312, bypass switch 313, feedback 314, input 315 output 316 and node 317. Domino logic unit 311 is coupled to a high voltage potential, ground potential, input 315 and output 316. Bypass circuit 312 is coupled to output 316 on one end and coupled to high potential on the other end. Bypass circuit 312 is also coupled to bypass switch 313. Bypass switch 313 is coupled to output 316 by feedback 314. Domino logic unit 311 generates a first signal state in response to a first set of input signals and generates a second signal state in response to a second set of input signals. Output 316 outputs an output signal for logic circuit 310 which can be the signal states generated by domino logic 311 or can be corresponding signal states to the signal states generated by domino logic unit 311 e.g. an inversion of the signal states generated by domino logic unit 311.

Domino logic unit 311 generates the first signal state by charging node 317 to high potential. Domino logic unit 311 generates a second signal state by maintaining node 317 at ground potential. Bypass circuit 312 provides a bypass path around domino logic unit 311 from node 317 to high potential. Bypass circuit 312 is controlled by bypass switch 313. When bypass switch 313 is activated, bypass circuit 312 is also activated and bypass circuit 312 provides a bypass path from node 317 to high potential. When bypass switch 313 is not activated, bypass circuit 312 does not provide the bypass path from node 317 to high potential.

In this embodiment, when domino logic unit 311 generates a first signal state, the first signal state is provided to switch unit 313 by feedback 314. In response to the first signal state, switch unit 313 is activated and as a result, bypass circuit 312 is also activated. A bypass path is created from node 317 to high potential which provides additional charge carrying capacity and thus allows for faster charging of node 317 to high potential.

FIG. 4 illustrates in circuit diagram form a logic circuit of a fourth embodiment of the present invention. Logic circuit 410 comprises domino logic unit 411, bypass circuit 412, bypass switch 413, feedback 414, input 415, output 416 and output 418. Logic circuit 410 also comprises inverter 420, p-type transistor 425 and n-type transistor 426. Domino logic unit 411 also comprises n-type transistor 421, n-type transistor 422, n-type transistor 423 and n-type transistor 424. In this embodiments logic circuit 410 precharges node 417 to a high potential (e.g. 5 volts or 3.3 volts) before performing the logical operation. Node 417 is precharged to a high potential when a logical-zero signal state is received over the dock signal line. The logical-zero signal state causes p-type transistor 425 to switch to the ON state. A conductive path is created between node 417 and the high potential thus charging node 417 to the high potential. At the same time, the logical-zero signal state causes n-type transistor 426 to switch to the OFF state. With n-type transistor 426 in the OFF state, the conductive path to ground potential is removed. When a logical-one signal state is received on the dock signal line, p-type transistor 425 switches to the OFF state and n-type transistor 426 switches to the ON state. Logic circuit 410 is now ready to perform the logical operation.

Domino logic unit 411 comprises four n-type transistors coupled in series. The drain of n-type transistor 421 is coupled to node 417 and the source of n-type transistor 421 is coupled to the drain of n-type transistor 422. The source of n-type transistor 422 is coupled to the drain of n-type transistor 423. The source of n-type transistor 423 is coupled to the drain of n-type transistor 424. The source of n-type transistor 424 is coupled to the drain of n-type transistor 426. The gates of n-type transistor 421, n-type transistor 422, n-type transistor 423 and n-type transistor 424 are each coupled to an input signal line. Input 415 comprises the four input signal lines. When all of the input signal lines of input 415 carry a logical-one signal state, n-type transistor 421, n-type transistor 422, n-type transistor 423 and n-type transistor 424 are all in the ON state. In addition, when a logical-one signal state is received over the dock signal line and domino logic unit 411 is ready to perform a logical operation, n-type transistor 426 is also in the ON state. In this situation, when the input signals and the dock signal are all in the logical-one signal state, n-type transistor 421, n-type transistor 422, n-type transistor 423, n-type transistor 424 and n-type transistor 426 are all in the ON state and a conductive path is created from node 417 to ground potential. This conductive path causes node 417 to discharge from the high potential to ground potential. On the other hand, when one of the input signal lines has a logical-zero signal state, the associated n-type transistor is in the OFF state. As a result, a conductive path is not created from node 417 to ground potential and node 417 does not discharge from a high potential to ground potential. Instead, node 417 is maintained at the high potential. The logical operation just described performed by domino logic unit 411 is a NAND operation. Inverter 420 inverts the signal state on node 417 to provide an output signal on output 416. With inverter 420 and domino logic unit 411 operating as described above, the output signal appearing on output 416 is the result of a logical AND operation on the input signals appearing on input 415. Output 418 transmits as an output signal the signal state appearing on node 417. This output signal on output 418 is the inversion of the output signal on output 416.

Output 416 is also coupled to bypass switch 413 by feedback 414. When node 417 begins to discharge from a high potential to ground potential (as a result of a logical-one signal state on all input signal lines and the dock signal line), output 416 begins to transition from a ground potential to a high potential. This transition is transmitted through feedback 414 to bypass switch 413. Since bypass switch 413 comprises a n-type transistor, bypass switch 413 begins to transition to the ON state from the OFF state. As a result, bypass circuit 412 begins to discharge node 417 from the high potential to ground potential. Thus, a conductive path is formed between node 417 and ground potential. This conductive path assists in the discharge of node 417 from the high potential to ground potential and allows node 417 to reach ground potential in a shorter period of time. As node 417 discharged further, output 416 transitions further to the logical-one signal state. Bypass switch 413 in turn transitions further into the ON state and bypass circuit 412 discharges more current from node 417 to ground potential. In this manner, a feedback effect occurs. As node 417 discharges, bypass circuit 412 becomes more conductive causing node 417 to discharge even more.

It will be appreciated that input 415 can comprise any number of input signal lines other than the four signal lines illustrated in FIG. 4. Domino logic unit 411, in this case, comprises the same number of n-type transistors as the number of input signal lines. Each gate of each n-type transistor is coupled to an input signal line. Domino logic unit 411 still performs a logical NAND operation on the input signal lines of input 415 and output 416 still outputs a logical AND result.

Under an alternative embodiment, bypass switch 413 can comprise a p-type transistor. In this situation, the gate of the p-type transistor is coupled to node 417 instead of output 416. Bypass switch 413 and logic circuit 410 operates similarly as described above.

FIG. 5 illustrates in circuit diagram form a logic circuit of a fifth embodiment of the present invention. Logic circuit 510 comprises domino logic unit 511, bypass circuit 512, bypass switch 513, feedback 514, input 515, output 516 and output 518. Logic circuit 510 also comprises inverter 520, p-type transistor 525 and n-type transistor 526. Domino logic unit 511 also comprises n-type transistor 521 and n-type transistor 522. In this embodiment, logic circuit 510 precharges node 517 to a high potential (e.g. 5 volts or 3.3 volts) before performing the logical operation similar to logic circuit 410 of FIG. 4.

Domino logic unit 511 comprises two n-type transistors coupled in parallel. The drain of n-type transistor 521 is coupled to node 517 and the source of n-type transistor 521 is coupled to the drain of n-type transistor 526. The drain of n-type transistor 522 is coupled to node 517 and the source of n-type transistor 522 is coupled to the drain of n-type transistor 526. The gates of n-type transistor 521 and n-type transistor 522 are each coupled to an input signal line. Input 515 comprises the two input signal lines. When one of the input signal lines of input 515 carry a logical-one signal state, n-type transistor 521 or n-type transistor 522 or both, as applicable, are all in the ON state. In addition, when a logical-one signal state is received over the clock signal line and domino logic unit 511 is ready to perform a logical operation, n-type transistor 526 is also in the ON state. In this situation, when at least one of the input signals and the dock signal are in the logical-one signal state, a conductive path is created from node 517 to ground potential. This conductive path causes node 517 to discharge from the high potential to ground potential. On the other hand, when all of the input signal lines has a logical-zero signal state, the associated n-type transistors are in the OFF state. As a result, a conductive path is not created from node 517 to ground potential and node 517 does not discharge from a high potential to ground potential. Instead, node 517 is maintained at the high potential. The logical operation just described performed by domino logic unit 511 is a NOR operation. Inverter 520 inverts the signal state on node 517 to provide an output signal on output 516. With inverter 520 and domino logic unit 511 operating as described above, the output signal appearing on output 516 is the result of a logical OR operation on the input signals appearing on input 515. Output 518 transmits as an output signal the signal state appearing on node 517. This output signal on output 518 is the inversion of the output signal on output 516.

Output 516 is also coupled to bypass switch 513 by feedback 514. When node 517 begins to discharge from a high potential to ground potential, output 516 begins to transition from a ground potential to a high potential. This transition is transmitted through feedback 514 to bypass switch 513. Bypass switch 513 begins to transition to the ON state from the OFF state. As a result, bypass circuit 512 begins to discharge node 517 from the high potential to ground potential. Thus, a conductive path is formed between node 517 and ground potential. This conductive path assists in the discharge of node 517 from the high potential to ground potential and allows node 517 to reach ground potential in a shorter period of time. As node 517 discharges further, output 516 transitions further to the logical-one signal state. Bypass switch 513 in turn transitions further into the ON state and bypass circuit 512 discharges more current from node 517 to ground potential resulting in a feedback effect.

Under an alternative embodiment, bypass switch 513 can comprise a p-type transistor. In this situation, the gate of the p-type transistor is coupled to node 517 instead of output 516. Bypass switch 513 and logic circuit 510 operates similarly as described above.

It will be appreciated that domino logic unit 511 can also perform other logical operations. These other logical operations can be implemented through combinations of NAND and NOR operations described above or can be implemented through different combinations of series and parallel n-type transistors.

FIG. 6 illustrates in flowchart form the operation of a logic circuit of a sixth embodiment of the present invention. The logic circuit generates a first signal state in response to a first set of input signals as shown in block 601. Alternatively, the logic circuit generates a second signal state in response to a second set of input signals as shown in block 602. The first set of input signals and the second set of input signals can be group propagate signals. The logic circuit then activates a bypass switch in response to the first signal state as shown in block 603 and bypasses a domino logic unit in response to the first signal state as shown in block 604.

Alternatively, the logic circuit can precharge the domino logic unit prior to receiving the first set of input signals or the second set of input signals. The logic circuit cart also provide the output signal to an adder circuit.

FIG. 7 illustrates in block diagram form an adder of a seventh embodiment of the present invention. Adder 700 receives as its inputs two 8n bit binary numbers and a carry-in signal ($C_i$). Adder 700 outputs a sum signal for each of the 8n bits. Each sum signal represents 1 bit of the sum of the two binary numbers. Adder 700 also outputs a carry-out signal ($C_{og4}$). Adder 700 comprises 4 groups, group 705, group 725, group 745 and group 765. Group 705 is coupled to group 725. Group 725 is coupled to group 745 and group 745 is coupled to group 765. Group 705 receives as inputs a carry-in signal and n bits of the two binary numbers. Group 705 outputs sum signals representing the n bits of the sum of the two binary numbers. Group 705 comprises sum device 710 group generate device 715 ($G_{g1}$) and group propagate device 720 ($P_{g1}$). Sum device 710 receives as inputs the carry-in signal and n bits of the two binary numbers. Sum device 710 outputs sum signals representing n bits of the sum of the two binary numbers. Group generate device 715 receives as inputs the n bits of the two binary numbers. Group generate device 715 generates a group generate signal when the sum of the n bits of the two binary numbers results in a carry to the n+1 bit. Group propagate device 720 receives as inputs the n bits of the two binary numbers. Group propagate device 720 generates a group propagate signal when the two binary numbers are such that a carry from previous bits (the carry-in signal) results in a carry to the n+1 bit. Group generate device 715 and group propagate device 720 are each coupled to a n channel transistor acting as a switch. In this manner, when group generate device 715 generates a group generate signal, group 705 generates a carry-out signal ($C_{og1}$) to group 725. Group 705 also generates a carry-out signal to group 725 when group propagate device 720 generates a group propagate signal combined with a carry-in signal from previous bits.

Group 725 operates similarly to group 705. It receives as inputs n+1 to 3n bits of the two binary numbers and the carry-out signal generated by group 705. It outputs sum signals representing the n+1 to 3n bits of the sum of the two binary numbers and also outputs a carry-out signal ($C_{og2}$) to group 745. Group 725 comprises sum device 730, group generate device 735 and group propagate device 740. Sum device 730, group generate device 735 and group propagate device 740 operate similarly to sum device 710, group generate device 715 and group propagate device 720 respectively. Sum device 730, group generate device 735 and group propagate device 740 differs only in that they accept as inputs n+1 to 3n bits of the two binary numbers and generate sum, group generate and group propagate signals accordingly.

Group 745 receives as inputs the 3n+1 to 6n bits of the two binary numbers and the carry-out signal ($C_{og2}$) from group 725. Group 745 outputs the sum signals for the 3n+1 to 6n bits of the sum of the two binary numbers and a carry-out ($C_{og3}$) to group 765. Group 745 comprises sum device 750, group generate device 755 and group propagate device 760. Sum device 750, group generate device 755 and group propagate device 760 operate similar to the sum devices, group generate devices and group propagate devices described above with the exception that they accept as inputs 3n+1 to 6n bits of the two binary numbers.

Group 765 receives as inputs the 6n+1 to 8n bits of the two binary numbers and the carry-out signal ($C_{og3}$) from group 745. It outputs sum signals representing 6n+1 to 8n bits of the sum of the two binary numbers and a carry-out signal ($C_{og4}$). Group 765 comprises sum device 770, group generate device 775 and group propagate device 780 all of which accept as inputs 6n+1 to 8n bits of the two binary numbers and operate similarly to the sum devices, group generate devices and group propagate devices described above.

Group propagate device 720, group propagate device 740, group propagate device 760 and group propagate device 780 can utilize logic circuit 210, logic circuit 310 or logic circuit 410 of FIG. 2, FIG. 3 or FIG. 4.

Figure 8:
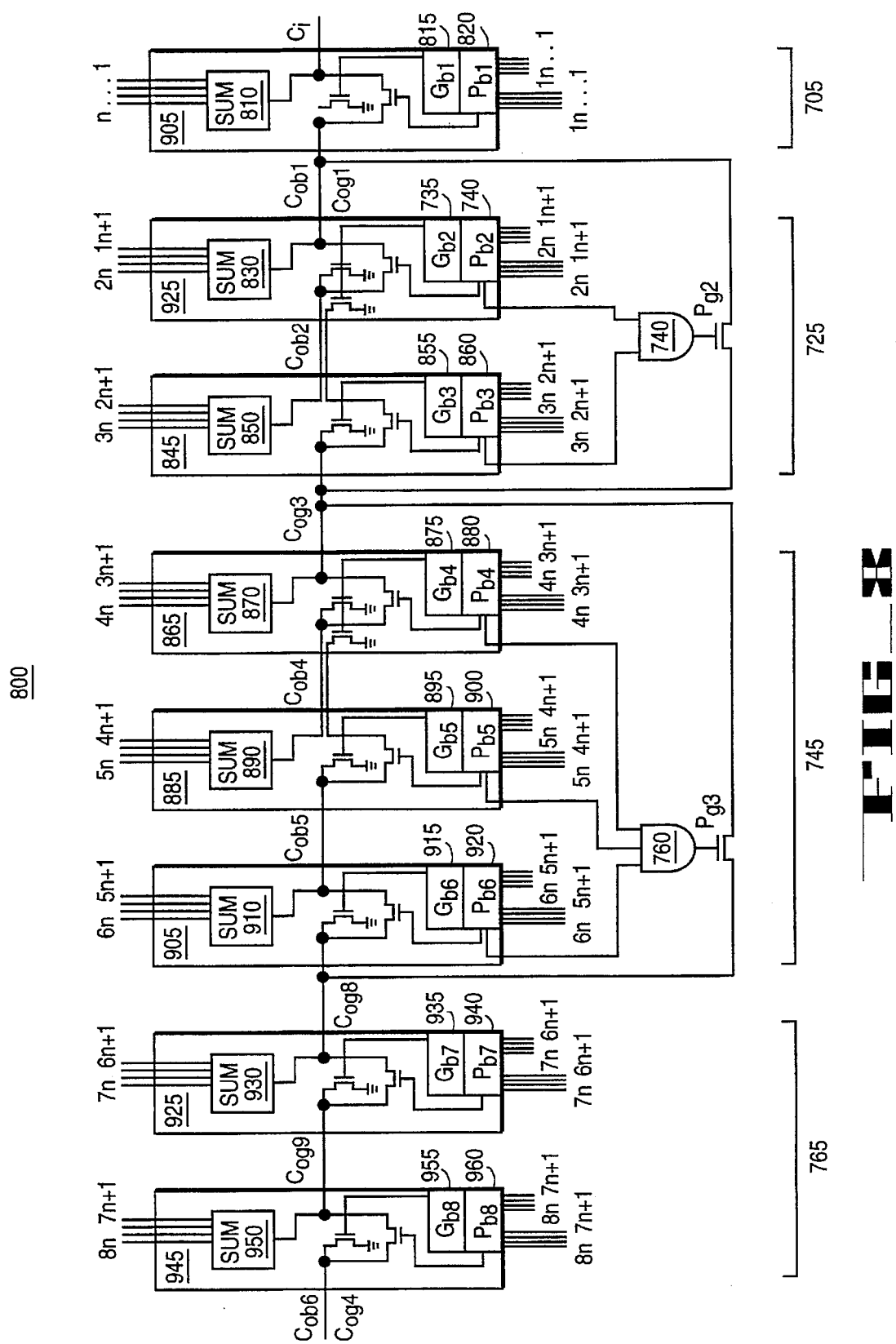
FIG. 8 illustrates in block diagram form the adder of a eighth embodiment of the present invention.

FIG. 8 illustrates in block diagram form the adder 800 of an eighth embodiment of the present invention. In this embodiment, group 705 comprises block 805. Block 805 receives as inputs a carry-in signal and the first n bits of the two binary numbers. Block 805 outputs sum signals representing the first n bits of the sum of the two binary numbers. Block 805 also outputs a carry-out signal for the block 805 ($C_{ob1}$). TMs signal is also the carry-out signal for group 705 ($C_{og1}$). Block 805 comprises sum device 810, block generate device 815 and block propagate device 820. Sum device 810 receives as inputs the first n bits of the two binary numbers and the carry-in signal. Block generate device 815 operates similarly to group generate device 715 of FIG. 7. Block generate device 815 generates a block generate signal when the sum of the first n bits of the two binary numbers results in a carry to the n+1 bit. The block generate signal activates an n channel transistor acting as a switch. In this manner, the carry-out signal to block 825 ($C_{ob1}$) is generated. Block propagate device 820 operates similar to group propagate device 720 of FIG. 7 except that block propagate device 820 receives as inputs the first n bits of the two binary numbers. When the first n bits of the two binary numbers are such that the carry-in signal results in a carry to the n+1 bit, block propagate device 820 generates a block propagate signal. This signal activates an n channel transistor acting as a switch. The n channel transistor is coupled to the carry-in signal line and transmits the carry-in signal through block 805 when block propagate device 820 generates a block propagate signal. In this manner, the carry-out signal to block 825 is generated by a block generate signal or a block propagate signal with a carry-in signal.

Group 725 receives the carry-out signal from block 805. Group 725 comprises block 825, block 845 and group propagate device 740. Block 825 receives as inputs the carry-out signal from block 805 and the second n bits of the two binary numbers. Block 825 outputs sum signals representing the second n bits of the sum of the two binary numbers, a carry-out signal ($C_{ob2}$) to block 845 and a block propagate signal to group propagate device 740. Block 825 comprises sum device 830, block generate device 835 and block propagate device 840. Sum device 830, block generate device 835 and block propagate device 840 operate similarly to the sum devices, block generate, group generate, block propagate and group generate devices described above. The difference is that sum device 830, block generate device 835 and block propagate device 840 accept the second n bits of the two binary numbers as inputs. Block 845 receives as inputs the third n bits of the two binary numbers and the carry-out signal ($C_{ob2}$) from block 825. Block 845 outputs sum signals representing the third n bits of the sum of the two binary numbers, a carry-out signal ($C_{og2}$) to block 865 and a block propagate signal to group propagate device 740. Block 845 comprises sum device 850, block generate device 855 and block propagate device 860, all of which operate similarly to the devices described above.

Group 725 also comprises group propagate device 740. In this embodiment, group propagate 740 is an AND gate. AND gate 740 receives as inputs the block propagate signal from block propagate device 840 and the block propagate signal from block propagate 860. AND gate 740 outputs the group propagate signal for group 725 and is coupled to an n channel transistor acting as a switch. When the group propagate signal is generated, the carry-out signal from 805 is transmitted through group 725 and thus a carry-out signal for group 725 is generated. It will be appreciated that in this embodiment sum device 830 and sum device 850 performs the functions of sum device 730 of FIG. 1. In addition, block generate device 835, block generate device 855 and block propagate device 860 perform the functions of group generate device 735 of FIG. 7. Group 725 generates a carry-out signal ($C_{og2}$) of group 745 to block 865.

Group 745 comprises block 865, block 885, block 905 and group propagate device 760. Block 865 receives as inputs a carry-out signal ($C_{og2}$) from group 725 and the fourth n bits of the binary numbers. Block 865 outputs the fourth n bits of the sum of the binary numbers, a carry-out signal ($C_{ob4}$) to block 885 and a block propagate signal to group propagate device 760. Block 865 comprises sum device 870, block generate device 875 and block propagate device 880. Sum device 870, block generate device 875 and block propagate device 880 operate similarly to the sum devices, block generate devices and block propagate devices described above with the exception that they receive as inputs the fourth n bits of the two binary numbers. Block 885 receives as inputs the carry-out signal ($C_{ob4}$) from block 865 and the fifth n bits of the two binary numbers. Block 885 outputs the fifth n bits of the sum two binary numbers, a carry-out signal ($C_{ob5}$) to block 905 and a block propagate signal to group propagate device 760. Block 885 comprises sum device 890, block generate device 895 and block propagate device 900. Sum device 890, block generate device 895 and block propagate device 900 operate similarly to the sum devices, block generate devices and block propagate devices as described above with the exception that they receive as inputs the fifth n bits of the two binary numbers. Block 905 receives as inpt/ts the carry-out signal ($C_{ob5}$) from block 885 and the sixth n bits of the two binary numbers. Block 905 outputs the sixth n bits of the sum of the two binary numbers, a block propagate signal to group propagate device 760 and the carry-out signal ($C_{og3}$) for group 745.

Group 745 also comprises group propagate device 760 which in this embodiment is an AND gate. AND gate 760 receives as inputs the block propagate signal from block propagate device 880, the block propagate signal from block propagate device 900 and block propagate device 920. AND gate 760 outputs the group propagate signal for group 745 and is coupled to a n channel transistor acting as a switch. When AND gate 760 transmits a group propagate signal, the carry-out signal from group 725 ($C_{og2}$) is transmitted through group 745 and becomes the carry-out signal from group 745 ($C_{og3}$). It will be appreciated that in this embodiment, sum device 870, sum device 890 and sum device 910 accomplish the functions of sum device 750 of FIG. 7. In addition, block generate device 875, block generate device 895, block generate device 915, block propagate device 900 and block propagate device 920 accomplish the functions of group generate device 755 of FIG. 7. In this manner, group 745 transmits a carry-out signal ($C_{og3}$) to group 765.

Group 765 comprises block 925 and block 945. Block 925 receives as inputs the carry-out signal ($C_{og3}$) from group 745 and the seventh n bits of the two binary numbers. Block 925 comprises sum device 930, block generate device 935 and block propagate device 940 all of which operate similarly as described above except that they receive as inputs the seventh n bits of the binary numbers. Block 925 outputs the seventh n bits of the sum of the two binary numbers and a carry-out signal ($C_{ob7}$) to block 945. Block 945 receives as inputs the carry-out signal ($C_{ob7}$) from block 925 and the eighth n bits of the two binary numbers. Block 945 comprises sum device 950, block generate device 955 and block propagate device 960 all of which operate similarly to the sum devices, block generate devices and block propagate devices described above with the exception that they receive as inputs the eighth n bits of the two binary numbers. Block 945 outputs the eighth n bits of the sum of the two binary numbers and a carry-out signal ($C_{ob8}$). This signal is also the carry-out signal for group 765 ($C_{og4}$).

Block propagate device 820, block propagate device 840, block propagate device 860, block propagate device 880, block propagate device 900, block propagate device 920, block propagate device 940, block propagate device 960, group propagate device 740 and group propagate device 760 can utilize logic circuit 210, logic circuit 310 or logic circuit 410 of FIG. 2, FIG. 3 or FIG. 4.

Figure 9:
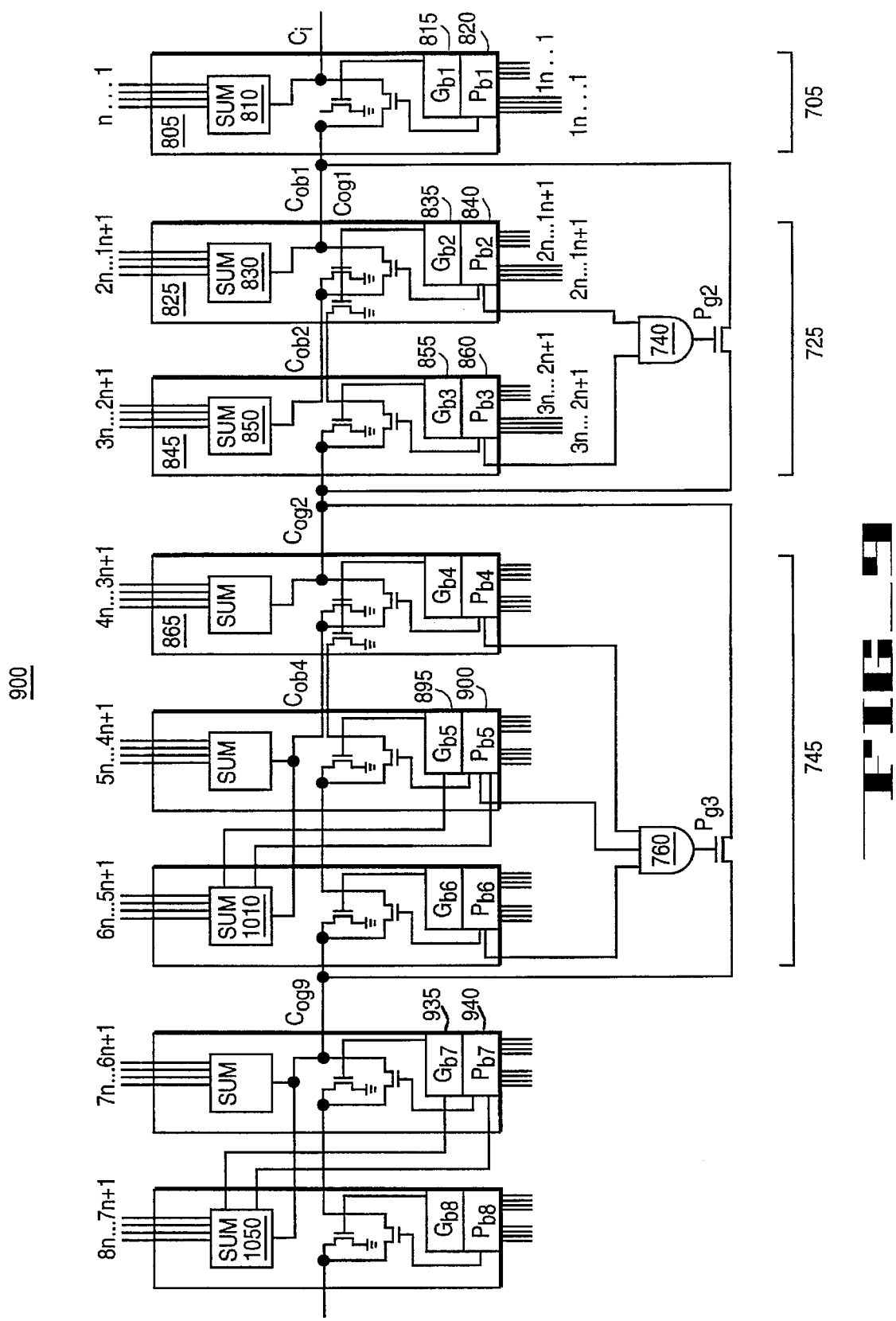
FIG. 9 illustrates in block diagram form an adder of a ninth embodiment of the present invention.

FIG. 9 illustrates in block diagram form an adder of a ninth embodiment of the present invention. The adder of FIG. 9 is similar to the adder of FIG. 8 with the exception that sum device 910 of FIG. 8 is replaced by sum device 1010 and sum device 950 of FIG. 8 is replaced by sum device 1050. Sum device 1010 receives as inputs the carry-out signal from block 865 ($C_{ob4}$), the block generate signal from block generate device 895, the block propagate signal from block propagate device 900 and the sixth n bits of the two binary numbers. Based on these inputs, sum device 1010 generates sum signals representing the sixth n bits of the sum of the two binary numbers. Sum device 1010 does not utilize $C_{ob}5$ as an input and thus it does not have to wait for a carry signal to ripple through block 785. Similarly, sum device 1050 receives as inputs the carry-out signal from group 745 ($C_{og3}$), the block generate signal from block generate device 935, the block propagate signal from block propagate device 940 and the eighth n bits of the two binary numbers. Based on these inputs, sum 1050 outputs the eighth n bits of the sum of the two binary numbers. Sum device 1050 does not utilize $C_{ob}7$ as an input and thus it does not have to wait for a carry signal to ripple through block 925. With sum device 1010 and sum device 1050, the grouping scheme illustrated in FIG. 9 is characterized as 1+1, 1+2, 2, 1.

Using the grouping scheme of FIG. 9, adder 900 can generate sum signals, carry signals, block generate signals, block propagate signals and group propagate signals as described in Table 1.

TABLE 1

| | |
|---|---|
| One Domino Gate Delay, | $G_{b1}, G_{b2}, G_{b3}, G_{b4}, G_{b5}, G_{b6}, G_{b7}, G_{b8}$ |
| One Precharge Cycle, | $P_{b1}, P_{b2}, P_{b3}, P_{b4}, P_{b5}, P_{b6}, P_{b7}, P_{b8}$ |
| One Discharge Cycle | |
| Two Domino Gate Delays, | sum (bits 1 ... n) |
| Two Precharge Cycles, | $C_{og1}$ |
| Two Discharge Cycles | $P_{g2}, P_{g3}$ |
| Three Domino Gate Delays, | sum (bits n + 1 ... 2n) |
| Three Precharge Cycles, | $C_{og2}$ |
| Three Discharge Cycles | $C_{ob2}$ |
| Four Domino Gate Delays, | sum (bits 2n + 1 ... 3n) |
| Four Precharge Cycles, | sum (bits 3n + 1 ... 4n) |
| Four Discharge Cycles | $C_{og3}$ |
| | $C_{ob4}$ |
| Five Domino Gate Delays, | sum (bits 4n + 1 ... 5n) |
| Five Precharge Cycles, | sum (bits 5n + 1 ... 6n) |
| Five Discharge Cycles | sum (bits 6n + 1 ... 7n) |
| | sum (bits 7n + 1 ... 8n) |

In this embodiment, n equals 4 and the adder 900 is a 32 bit adder. Other adders can be constructed using the configurations as described in Table 2.

TABLE 2

| | # of blocks | |
|---|---|---|
| 16 bit adder | 4 | 1, 2, 1 |
| 20 bit adder | 5 | 1 + 1, 2, 1 |
| 24 bit adder | 6 | 1, 2, 2, 1 |
| 28 bit adder | 7 | 1 + 1, 2, 2, 1 |
| 32 bit adder | 8 | 1 + 1, 1 + 2, 2, 1 |
| 36 bit adder | 9 | 1, 2, 3, 2, 1 |
| 40 bit adder | 10 | 1 + 1, 2, 3, 2, 1 |
| 44 bit adder | 11 | 1 + 1, 1 + 2, 3, 2, 1 |
| 48 bit adder | 12 | 1, 2, 3, 3, 2, 1 |
| 52 bit adder | 13 | 1 + 1, 2, 3, 3, 2, 1 |
| 56 bit adder | 14 | 1 + 1, 1 + 2, 3, 3, 2, 1 |
| 60 bit adder | 15 | 1 + 1, 1 + 2, 1 + 3, 3, 2, 1 |
| 68 bit adder | 17 | 1 + 1, 1 + 2, 3, 4, 3, 2, 1 |
| 72 bit adder | 18 | 1 + 1, 1 + 2, 3, 4, 3, 2, 1 |
| 76 bit adder | 19 | 1 + 1, 1 + 2, 1 + 3, 4, 3, 2 |
| 80 bit adder | 20 | 1, 2, 3, 4, 4, 3, 2, 1 |

Figure 10:
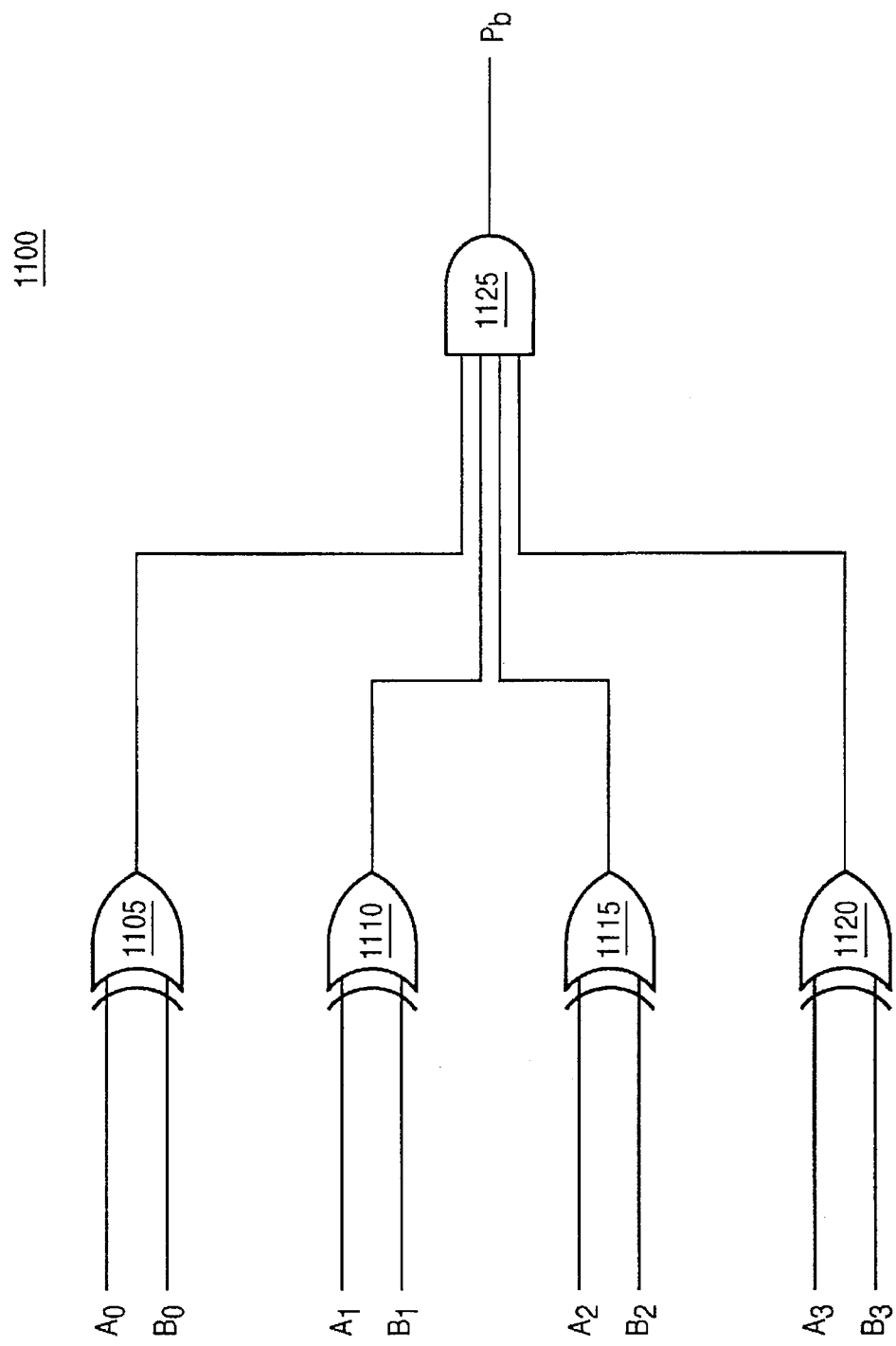
FIG. 10 illustrates in logic diagram form the block propagate device of a tenth embodiment of the present invention.

FIG. 10 illustrates in logic diagram form the block propagate device of a tenth embodiment of the present invention. In this embodiment, the adder is a bit adder and thus n equals 4. Each block of the adder receives as inputs four bits of two binary numbers. The four bits of the first binary number are labeled $A_0, A_1, A_2, A_3$. The four bits of the second binary number are labeled $B_0, B_1, B_2, B_3$. Block propagate device 1100 comprises exclusive-OR gates 1105, 1110, 1115 and 1120. Block propagate device 1100 also comprises AND gate 1125. Block propagate device 1100 receives the $A_0$ bit and the $B_0$ bit inputting them to exclusive-OR gate 1105. Block propagate device 1100 also receives the $A_1$ bit and the $B_1$ bit inputting them into exclusive-OR gate 1110. Likewise, block propagate device 1100 receives the $A_2$ bit and the $B_2$ bit inputting them into exclusive-OR gate 1115. Block propagate device 1100 receives the $A_3$ bit and the $B_3$ bit inputting them into exclusive-OR gate 1120. The outputs of exclusive-OR gates 1105, 1110, 1115 and 1120 are provided as inputs to AND gate 1125. In this manner, AND gate 1125 generates the block propagate signal. Block propagate device 1100 can be used in place of block propagate device 820, 840, 860, 880, 900, 920, 940 or 960 of FIG. 8.

AND gate 1125 can utilize logic circuit 210, logic circuit 310 or logic circuit 410 of FIG. 2, FIG. 3 or FIG. 4.

Figure 11:
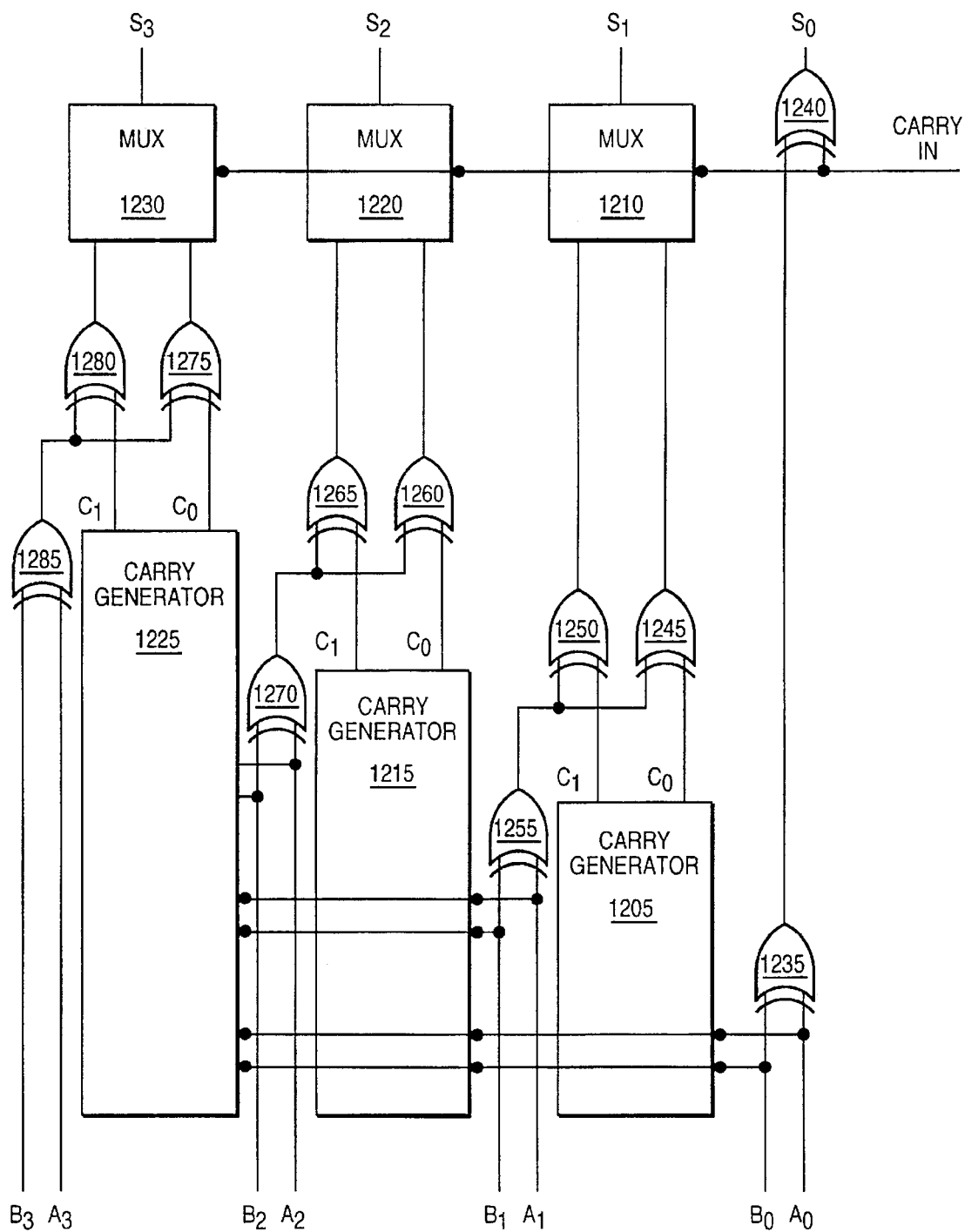
FIG. 11 illustrates in block diagram form the sum device of an eleventh embodiment of the present invention.

FIG. 11 illustrates in block diagram form the sum device of an eleventh embodiment of the present invention. In this embodiment, like the tenth embodiment, the adder is a 32 bit adder and thus n equals 4. Each block receives as its input 4 bits of two binary numbers. The four bits of the first binary number are labeled $A_0$, $A_1$, $A_2$ and $A_3$. The four bits of the second binary number are labeled $B_0$, $B_1$, $B_2$ and $B_3$. Sum device 1200 receives as its inputs both four bits of the two binary numbers and a carry-in signal from the previous block or previous group. Sum device 1200 outputs sum signals representing the sum of the four bits of the two binary numbers. These four bits are labeled as $S_0$, $S_1$, $S_2$ and $S_3$. Sum device 1200 comprises carry generator 1205, multiplexor 1210, carry generator 1215, multiplexor 1220, carry generator 1225 and multiplexor 1230. To generate the first of the four bits of the sum of the two binary numbers, sum device 1200 first receives as inputs the $A_0$ bit and $B_0$ bit. The $A_0$ bit and $B_0$ bit are provided as inputs to exclusive-OR gate 1235. The output of exclusive-OR gate 1235 is provided as an input to exclusive-OR gate 1240 along with the carry-in signal. The output of exclusive-OR gate 1240 becomes the sum signal representing the first of the four bits of the sum of the two binary numbers.

To generate the second of four bits comprising the sum of the two binary numbers, sum device 1200 receives as inputs the $A_0$ bit and $B_0$ bit into carry generator 1205. Carry generator 1205 generates signals representing the carry after summing the $A_0$ bit, the $B_0$ bit and all lower bits. The first signal ($C_0$) represents the carry when the carry-in signal provided to sum device 1200 is a zero. The second signal ($C_1$) represents the carry when the carry-in signal to sum device 1200 is a one. Sum device 1200 also receives as inputs the $A_1$ bit and $B_1$ bit which are in turn provided as inputs to exclusive-OR gate 1255. The output of exclusive-OR gate 1255 is provided as an input to exclusive-OR gate 1250 along with the $C_1$ carry signal from carry generator 1205. The output of exclusive-OR gate 1255 is also provided to exclusive-OR gate 1245 along with the $C_0$ carry signal from carry generator 1205. The output of exclusive-OR gate 1250 represents the second sum signal of the four bits comprising the sum when the carry-in signal to sum device 1200 is a one. On the other hand, the output of exclusive-OR gate 1245 represents the second sum signal of the four bits comprising the sum when the carry-in signal provided to sum device 1200 is a zero. The output of exclusive-OR gate 1250 and the output of exclusive-OR 1245 gate are provided as inputs to multiplexor 1210. Multiplexor 1210 selects either the output of exclusive-OR gate 1250 or the output of exclusive-OR 1245 gate based on the carry-in signal provided to sum device 1200. If the carry-in signal is a one, multiplexor 1210 selects the output of exclusive-OR gate 1250. On the other hand, if the carry-in signal is a zero, multiplexor 1210 selects the output of exclusive-OR gate 1245.

To generate the third of four bits comprising the sum of the two binary numbers, sum device 1200 receives as inputs the $A_0$ bit, the $B_0$ bit, the $A_1$ bit and the $B_1$ bit. The $A_0$ bit, the $B_0$ bit, the $A_1$ bit and the $B_1$ bits are provided to carry generator 1215. Carry generator 1215 generates two signals representing the carry after summing the $A_1$ bit, the $B_1$ bit and all lower bits. Sum device 1200 also receives as inputs $A_2$ bit and the $B_2$ bit which are in turn provided as inputs to exclusive-OR gate 1270. The output of exclusive-OR gate 1270 is provided as an input to exclusive-OR gate 1265 along with one of the carry signals from carry generator 1215. The output of exclusive-OR gate 1270 is also provided as an input to exclusive-OR gate 1260 along with the other carry signal from carry generator 1215. The Output of exclusive-OR gate 1265 represents the third of four bits of the sum of two binary numbers when the carry-in signal to sum device 1200 is a one. The output of exclusive-OR gate 1260 represents the third of four bits of the sum of the two binary numbers when the carry-in signal to sum device 1200 is a zero. Multiplexor 1220 selects between the output of exclusive-OR gate 1265 and the output of exclusive-OR gate 1260 in a manner similar to multiplexor 1210.

To generate the fourth of four bits comprising the sum of the two binary numbers, sum device 1200 receives the $A_0$, $B_0$, $A_1$, $B_1$, $A_2$ and $B_2$ bits as inputs to carry generator 1225. Carry generator 1225 generates signals representing the carry after summing the $A_2$ bit, the $B_2$ bit and all other lower bits. Sum device 1200 also receives as inputs the $A_3$ bit and the $B_3$ bit. The $A_3$ and $B_3$ bits are provided as inputs to exclusive-OR gate 1285. The output of exclusive-OR gate 1285 is provided as an input to exclusive-OR gate 1280 along with one of the carry signals from carry generator 1225. The output of exclusive-OR gate 1285 is also provided as an input to exclusive-OR gate 1275 along with the other carry signal from carry generator 1225. The output of exclusive-OR gate 1280 represents the fourth of four bits of the sum of the two binary numbers when the carry-in signal to the sum device 1200 is a one. On the other hand, the output of exclusive-OR gate 1275 represents the fourth of four bits of the sum of the two binary numbers when the carry-in signal to the sum device 1200 is a zero. Multiplexor 1230 selects from the output of exclusive-OR gate 1280 and the output of exclusive-OR gate 1275 in a manner similar to multiplexor 1220 and multiplexor 1210.

It will be appreciated that sum device 1200 of FIG. 11 employs lookahead techniques. Sum device 1200 determines the possible values for the $S_1$, $S_2$ and $S_3$ bits before receiving the carry-in signal from previous blocks or groups. By the time the carry-in signal arrives at the sum device, sum device 1200 has already determined the possible values for the $S_1$, $S_2$ and $S_3$ bits. When the carry-in signal arrives, it is used by multiplexors 1210, 1220 and 1230 to select the proper values for the $S_1$, $S_2$ and $S_3$ bits. In this manner, sum device 1200 is able to output the $S_1$, $S_2$ and $S_3$ bits shortly after it receives the carry-in signal. It does not have to wait for the carry-in signal to ripple through the sum device. Sum device 1200 of FIG. 11 can be used in place of sum device 810, 830, 850, 870, 890, 910, 930 or 950 of FIG. 8.

Figure 12:
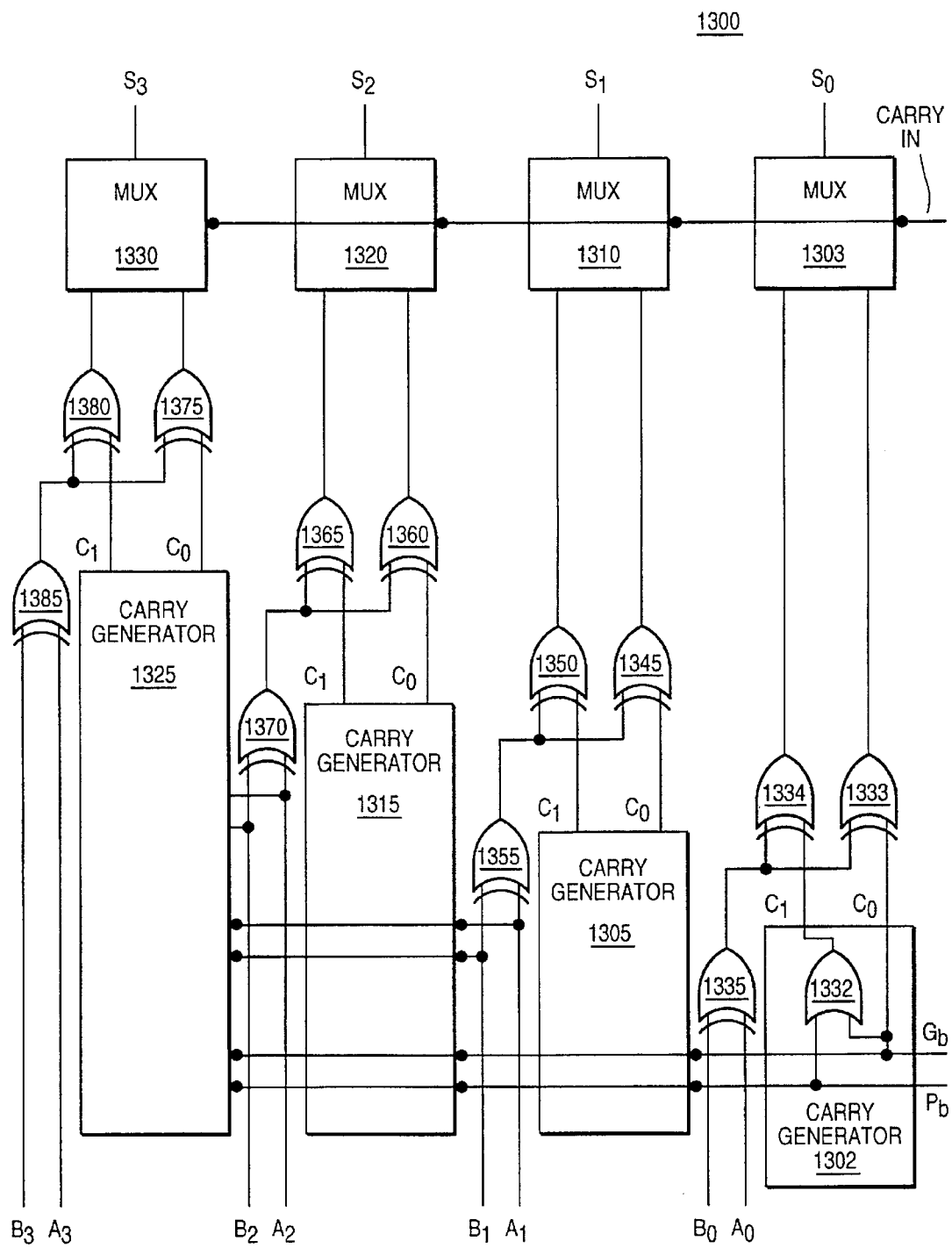
FIG. 12 illustrates in block diagram form the sum device of a twelfth embodiment of the present invention.

FIG. 12 illustrates in block diagram form the sum device of a twelfth embodiment of the present invention. In this embodiment, sum device 1300 operates similarly to the sum device of FIG. 11 with the following exceptions. Instead of receiving a carry-in signal from the previous block, sum device 1300 of the seventh embodiment receives a carry-in signal from a block prior to the previous block. As a consequence, the three carry generators receive as inputs a block generate signal and a block propagate signal from the prior block in addition to the inputs described under FIG. 11. It will be appreciated that sum device 1300 also employs lookahead techniques. Sum device 1300 generates possible values for the $S_0$, $S_1$, $S_2$ and $S_3$ bits in advance. When the carry-in signal from the block prior to the previous block is generated, sum device 1300 selects the proper value for $S_0$, $S_1$, $S_2$ and $S_3$ bits. In this manner, the sum signals for the present block can be generated at the same time as the sum signals for the previous block by using the same sum select signal. Sum device 1300 can be used in place of sum device 1010 or 1050 of FIG. 9. Here, the carry-in signal would be the carry-out signal from block 865 ($C_{Ob4}$) or the carry-out signal from group 745 ($C_{Og3}$).

Figure 13:
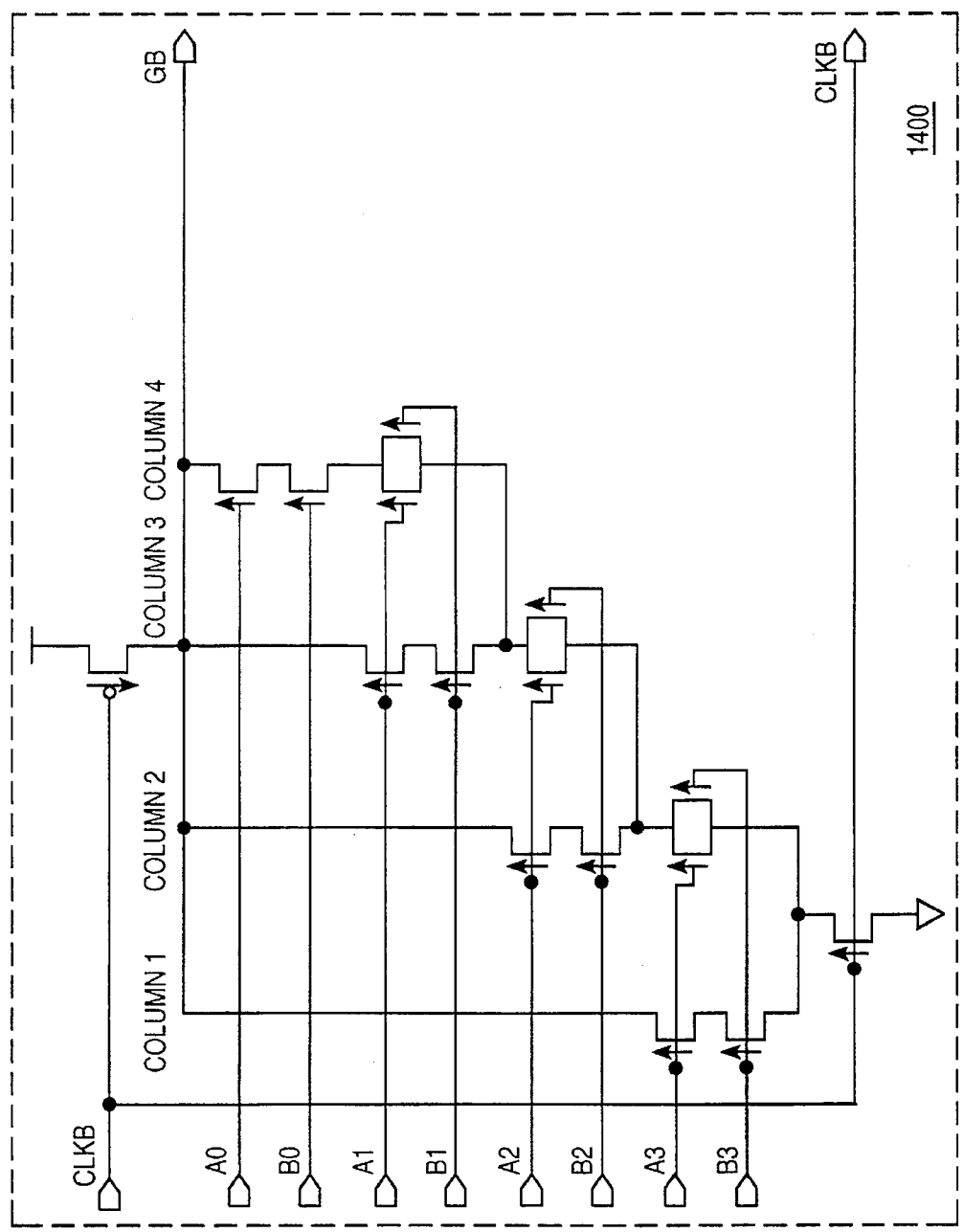
FIG. 13 illustrates in circuit diagram form a block generate device of an thirteenth embodiment of the present invention.

FIG. 13 illustrates in circuit diagram form a block generate device of a thirteenth embodiment of the present invention. Block generate device 1400 receives the $A_0$, $B_0$, $A_1$, $B_1$, $A_2$, $B_2$, $A_3$, and $B_3$ bits as inputs. It outputs a block generate signal for the bits it receives as inputs. Block generate device 1400 comprises four columns. The four columns are coupled in parallel and the gates of the transistors are coupled to the inputs. Thus, block generate device 1400 can generate a block generate signal after one domino gate delay. Block generate 1400 device can also generate a block generate signal with one precharge cycle or with one discharge cycle. The first column comprises two n-channel transistors coupled in series. The gate of one transistor is coupled to the $A_3$ bit and the gate of the other transistor is coupled to the $B_3$ bit. The two n-channel transistors coupled in series acts as a NAND gate. Column 2 comprises of the series combination of two n-channel transistors and two n-channel transistors coupled in parallel. The gate of one n-channel transistor in series is coupled to the $A_2$ bit and the gate of the other n-channel transistor in series is coupled to the $B_2$ bit. The gate of one n-channel transistor in parallel is coupled to the $A_3$ bit and the gate of the other n-channel transistor in parallel is coupled to the $B_3$ bit. The two n-channel transistors in series act as a NAND gate and the two n-channel transistors in parallel act as a NOR gate. Column 3 is similar to column 2 except that the gate of one n-channel transistor in series is coupled to the $A_1$ bit, the gate of the other n-channel transistor in series is coupled to the $B_1$ bit, the gate of one n-channel transistor in parallel is coupled to the $A_2$ bit and the gate of the other n-channel transistor in parallel is coupled to the $B_2$ bit. The fourth column is similar to the third column except that the gate of one n-channel transistor in series is coupled to the $A_0$ bit, the gate of the other n-channel transistor in series is coupled to the $B_0$ bit, the gate of one n-channel transistor in parallel is coupled to the $A_1$ bit and the gate of the other n-channel transistor in parallel is coupled to the $B_1$ bit. The n-channel transistors in parallel of column 2 is not only coupled to the n-channel transistors in series but is also coupled to column 3 by a parallel connection. This allows the n-channel transistors in parallel of column 2 to provide signals not only to column 2 but also to column 3 and results in the reduction of two transistors from the circuit. Similarly the n-channel transistors of column 3 is not only coupled to the n-channel transistors in series but is also coupled to column 4. This allows for the additional reduction of four transistors of the circuit (two for the parallel transistors in column 3 and two for the parallel transistors in column 2). It will be appreciated that the n-channel transistors in series transmit an equivalent of a generate signal for the respective A and B bits. On the other hand, the n-channel transistors in parallel transmit the equivalent of a propagate signal for the respective A and B bits. Block generate device 1400 also utilizes a precharge mechanism for speed. When the clock signal is low, the block generate line is charged to a high potential. During evaluation, the clock signal switches high. The p-channel transistor coupled to the clock signal is turned off and the n-channel transistor coupled to the clock signal is turned on. When the conditions for a block generate signal is satisfied, an electrical path to ground is created from the block generate line. This path to ground discharges the block generate line, thus creating the block generate signal. It will be appreciated that the block generate signal described above is an active low signal. Block generate device 1400 can be used in place of block generate device 815, 835, 855, 875, 895, 915, 935 or 955 of FIG. 8.

Figure 14:
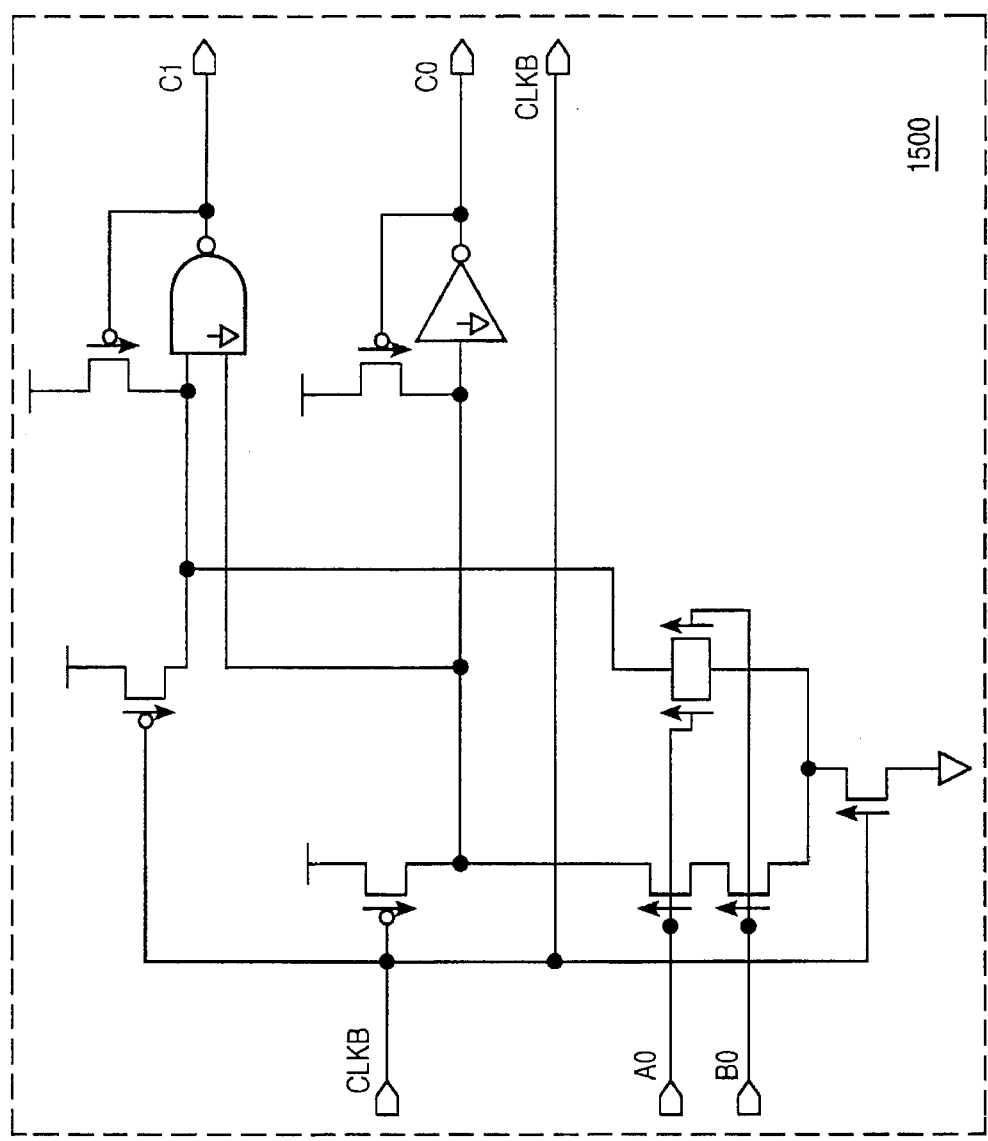
FIG. 14 illustrates in circuit diagram form a carry generator of a fourteenth embodiment of the present invention.

FIG. 14 illustrates in circuit diagram form a carry generator of a fourteenth embodiment of the present invention. Carry generator 1500 receives as its inputs the $A_0$ bit and the $B_0$ bit. It outputs signals representing the carry after summing the $A_0$ bit, the $B_0$ bit and all lower bits. The first carry signal ($C_1$) represents the carry when the carry-in signal to the $A_0$ and $B_0$ bits is a 1. On the other hand the second carry signal ($C_0$) represents the carry when the carry-in to the $A_0$ and the $B_0$ bits is a 0. The n-channel transistors in series and the n-channel transistors in parallel function similarly as in block generate device 1400 of FIG. 13. Carry generator 1500 can generate a carry signal after one domino gate delay. Carry generator 1500 can also generate a carry signal with one precharge cycle or with one discharge cycle. In addition, carry generator 1500 utilizes the precharged techniques and active blow features as in block generate device 1400 of FIG. 13. Carry generator 1500 can be utilized in place of carry generator 1205 of FIG. 11.

Figure 15:
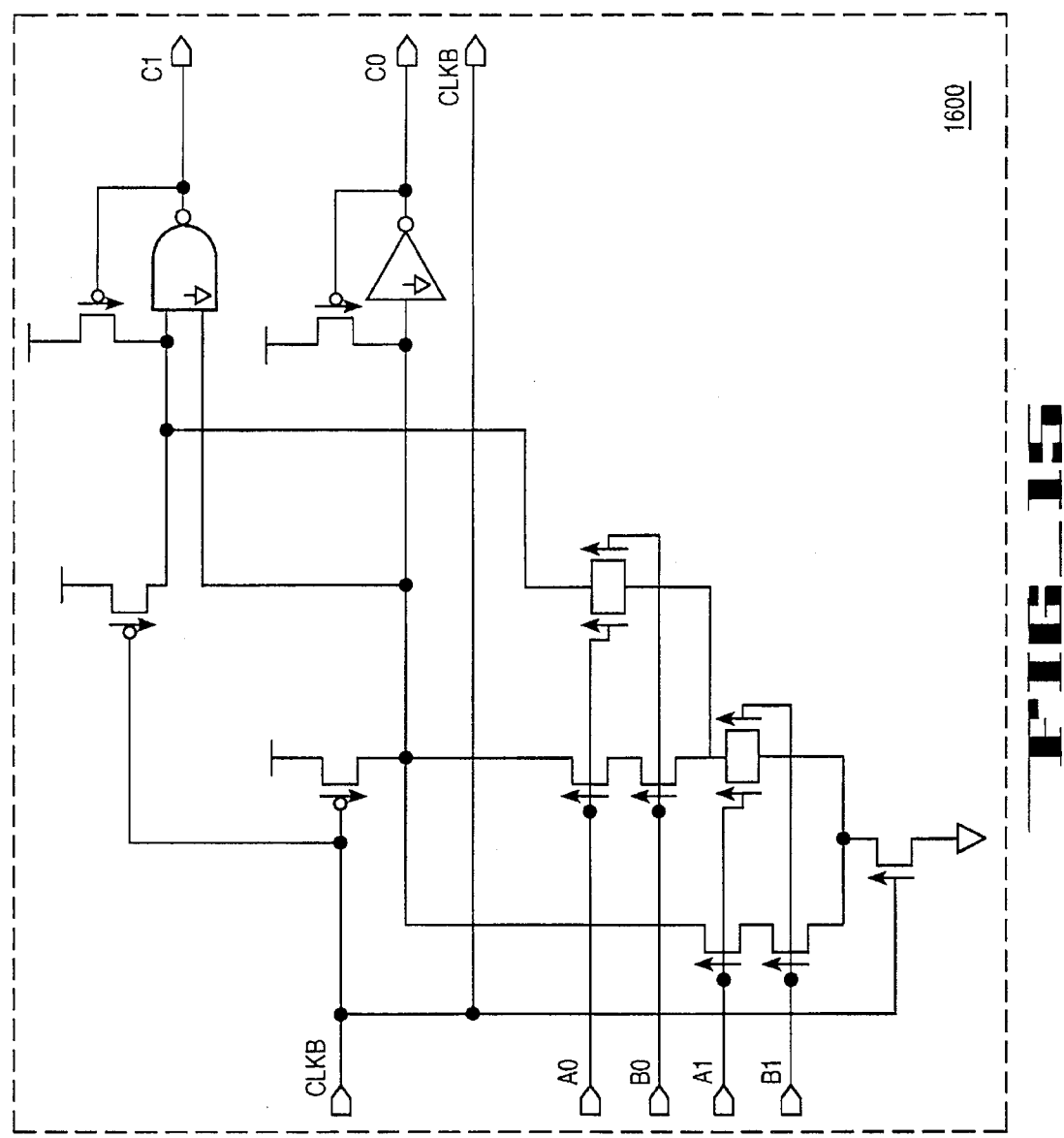
FIG. 15 illustrates in circuit diagram form a carry generator of a fifteenth embodiment of the present invention.

FIG. 15 illustrates in circuit diagram form a carry generator of a fifteenth embodiment of the present invention. Carry generator 1600 receives as inputs the $A_0$ bit, the $B_0$ bit, the $A_1$ bit and the $B_1$ bit. Carry generator 1600 generates two signals representing the carry after summing the $A_1$ bit, the $B_1$ bit and all lower bits. The first signal ($c_1$) represents the carry to the third bit to generate the third of four bits of the sum of two binary numbers when the carry-in signal from the previous block is a one. The second signal ($c_0$) represents the carry to the third bit to generate the third of four bits of the sum of the two binary numbers when the carry-in signal from the previous block is a zero. The n channel transistors in series operate similarly to the n channel transistors in series of FIG. 13 and the n channel transistors in parallel operate similarly to the n channel transistors in parallel of FIG. 13. Carry generator 1600 can generate a carry signal after one domino gate delay. Carry generator 1600 can also generate a carry signal with one precharge cycle or with one discharge cycle. In addition, carry generator 1600 employs precharge techniques and active low features as described under FIG. 13. Carry generator 1600 can be utilized as carry generator 1215 of FIG. 11.

Figure 16:
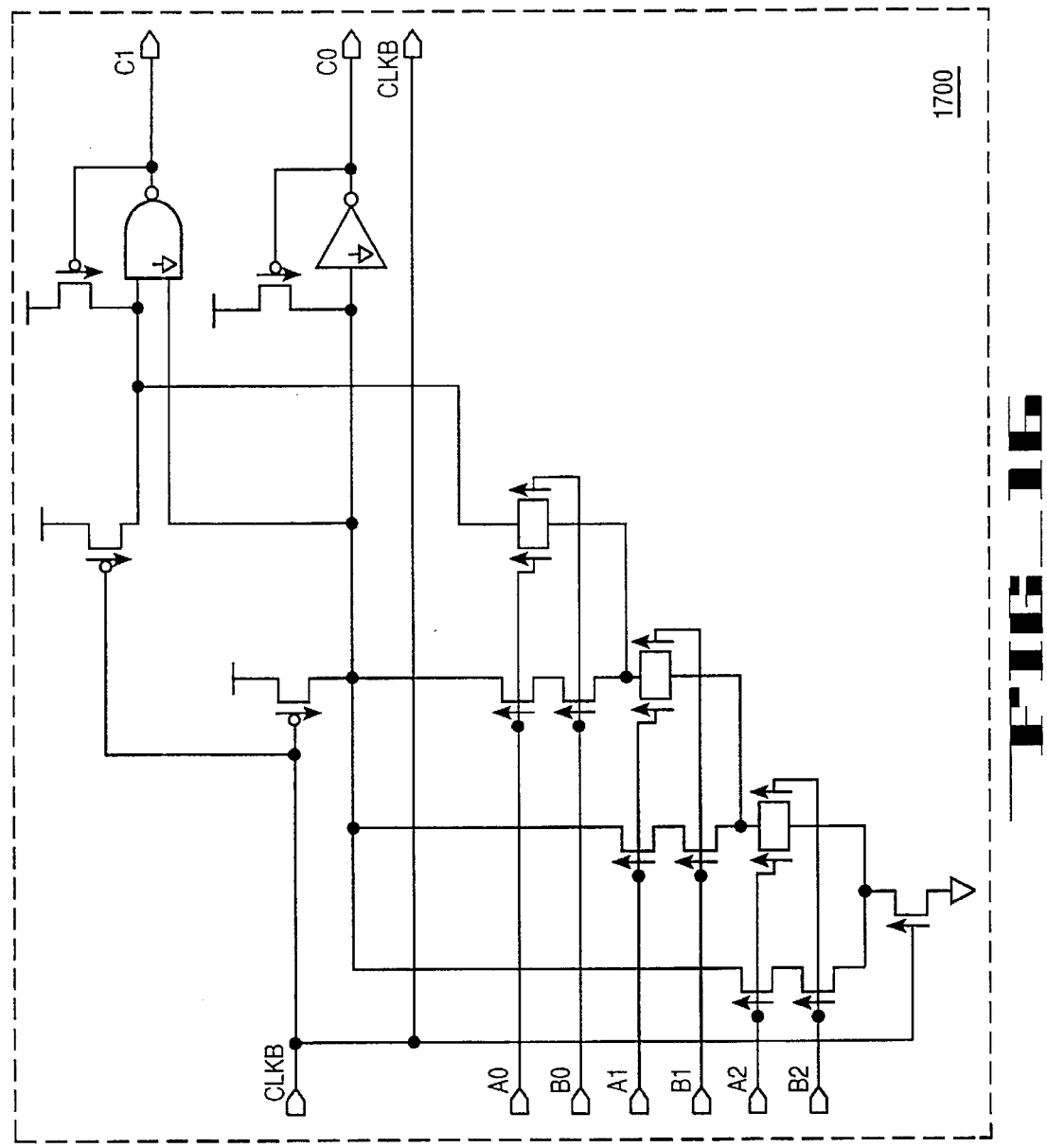
FIG. 16 illustrates in circuit diagram form a carry generator of an sixteenth embodiment of the present invention.

FIG. 16 illustrates in circuit diagram form a carry generator of a sixteenth embodiment of the present invention. Carry generator 1700 receives as inputs the $A_0$ bit, the $B_0$ bit, the $A_1$ bit, the $B_1$ bit, the $A_2$ bit and the $B_2$ bit. Carry generator 1600 generates two signals representing the carry after summing the $A_2$ bit, the $B_2$ bit and all lower bits. The first signal ($c_1$) represents the carry to the fourth bit to generate the fourth of four bits of the sum of two binary numbers when the carry-in signal from the previous block is a one. The second signal ($c_0$) represents the carry to the fourth bit to generate the fourth of four bits of the sum of the two binary numbers when the carry-in signal from the previous block is a zero. The n channel transistors in series and the n channel transistors in parallel operate similarly as described above. Carry generator 1700 can generate a carry signal after one domino gate delay. Carry generator 1700 can also generate a carry signal with one precharge cycle or with one discharge cycle. The circuit which generates the $C_0$ signal and the circuit which generates the $C_1$ signal shares hardware which reduces device count and gate loading. In addition, carry generator 1700 employs precharge techniques and active low features as described above. Carry generator 1700 can be utilized as carry generator 1225 of FIG. 11.

Figure 17:
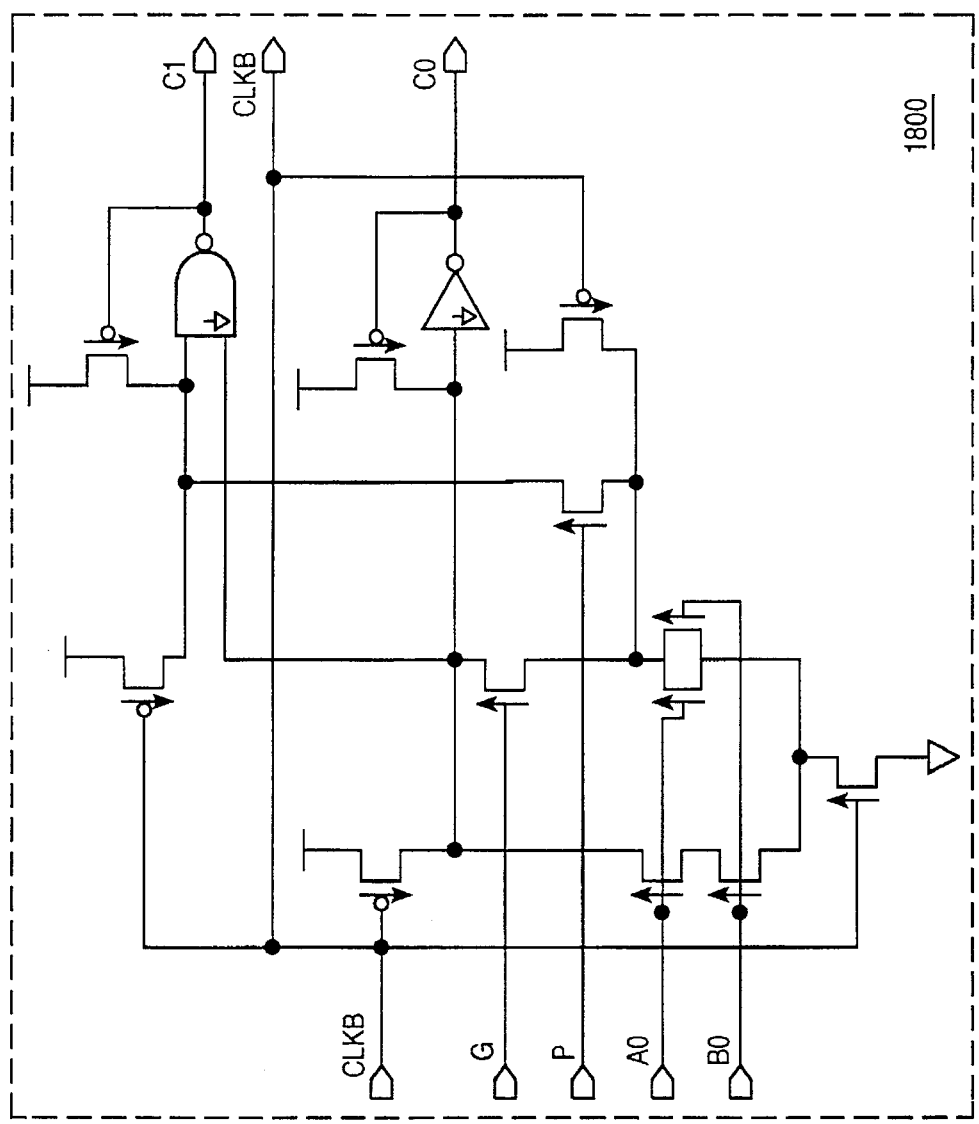
FIG. 17 illustrates in circuit diagram form a carry generator of a seventeenth embodiment of the present invention.

FIG. 17 illustrates in circuit diagram form a carry generator of a seventeenth embodiment of the present invention. Carry generator 1800 receives as inputs the $A_0$ bit, the $B_0$ bit, a block propagate signal from the previous block and a block generate signal from the previous block. Carry generator 1800 generates two signals representing the carry after summing the $A_0$ bit, the $B_0$ bit and all lower bits. The first signal ($c_1$) represents the carry to the second bit to generate the second of four bits of the sum of two binary numbers when the carry-in signal from the block prior to the previous block is a one. The second signal ($c_0$) represents the carry to the second bit to generate the second of four bits of the sum of the two binary numbers when the carry-in signal from the block prior to the previous block is a zero. The n-channel transistors in series and the n channel transistors in parallel operate similarly as described above. The circuit which generates the $C_0$ signal and the circuit which generates the $C_1$ signal share hardware which reduces device count and gate loading. Carry generator 1800 can generate a carry signal after one domino gate delay. Carry generator 1800 can also generate a carry signal with one precharge cycle or with one discharge cycle. In addition, carry generator 1800 employs precharge techniques and active low features as described above. Carry generator 1800 can be utilized as carry generator 1205 of FIG. 12.

FIG. 18 illustrates in circuit diagram form a carry generator of an eighteenth embodiment of the present invention. Carry generator 1900 receives as inputs the $A_0$ bit, the $B_0$ bit, the $A_1$ bit, the $B_1$ bit, a block propagate signal from the previous block and a block generate signal from the previous block. Carry generator 1900 generates two signals representing the carry after summing the $A_1$ bit, the $B_1$ bit and all lower bits. The first signal ($c_1$) represents the carry to the third bit to generate the third of four bits of the sum of two binary numbers when the carry-in signal from the block prior to the previous block is a one. The second signal ($c_0$) represents the carry to the third bit to generate the third of four bits of the sum of the two binary numbers when the carry-in signal from the block prior to the previous block is a zero. The n channel transistors in series and the n channel transistors in parallel operate similarly as described above. Carry generator 1900 can generate a carry signal after one domino gate delay. Carry generator 1900 can also generate a carry signal with one precharge cycle or with one discharge cycle. In addition, carry generator 1900 employs precharge techniques and active low features as described above. Carry generator 1900 can be utilized as carry generator 1215 of FIG. 12.

Figure 19:
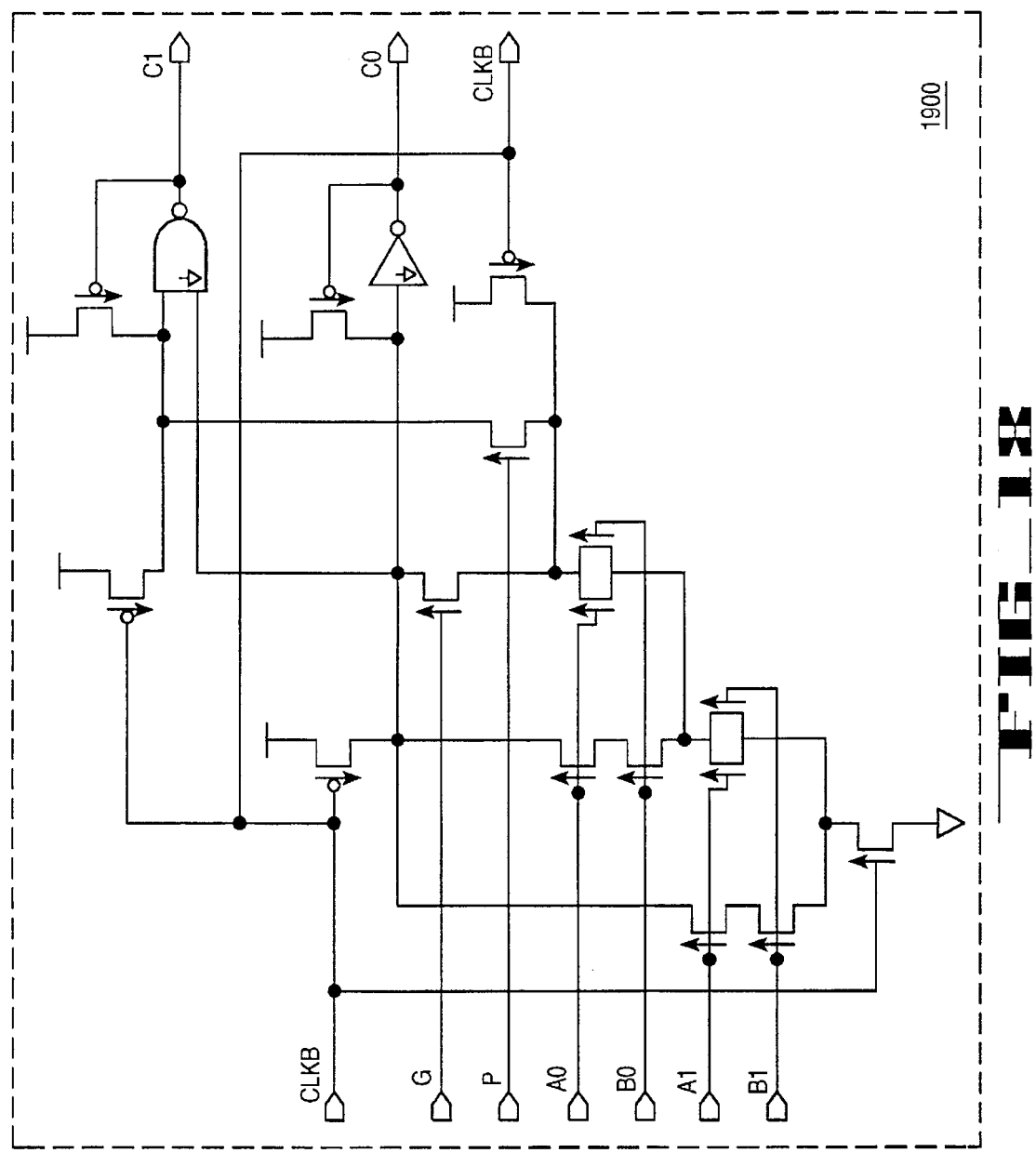
FIG. 19 illustrates in circuit diagram form a carry generator of a nineteenth embodiment of the present invention.
Figure 19:
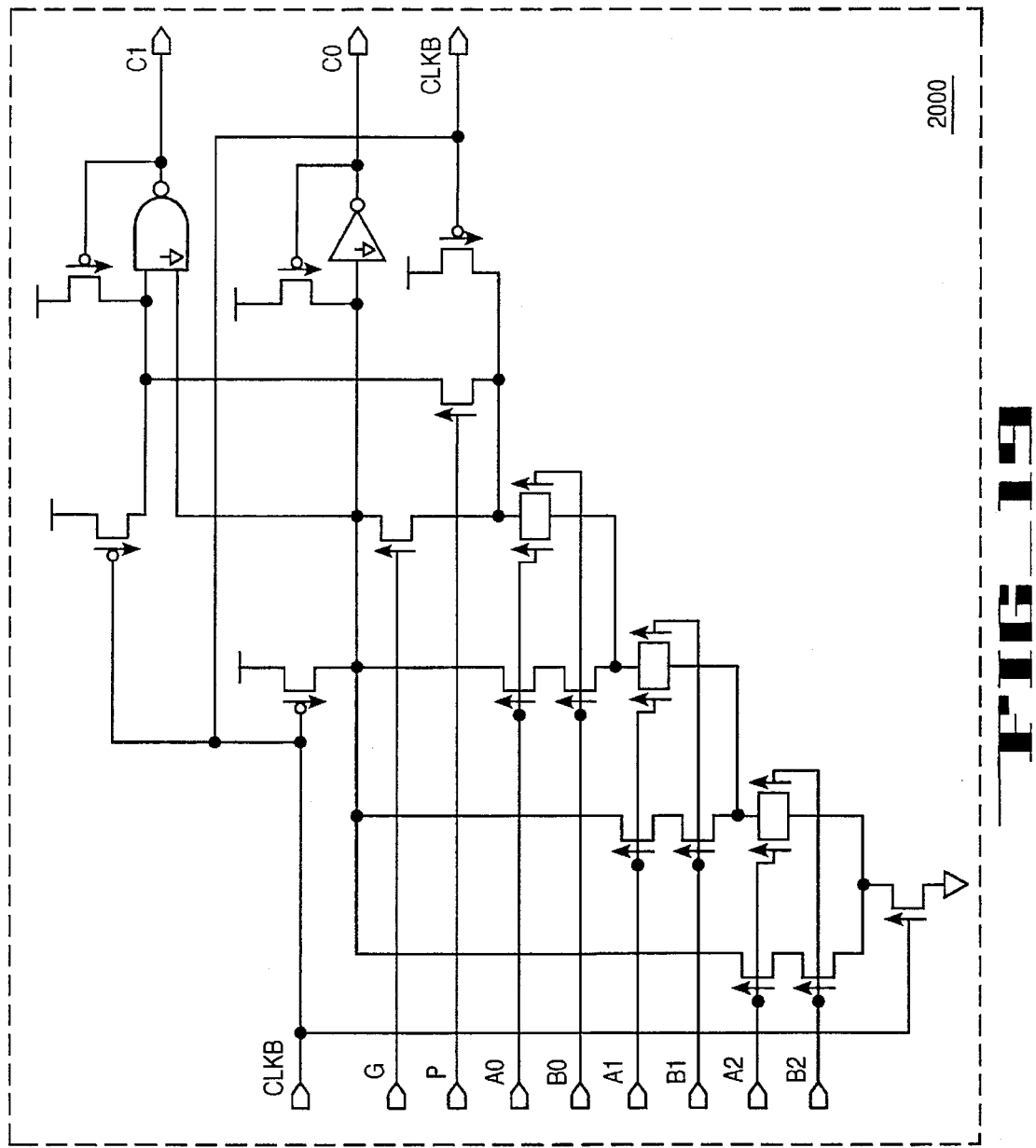

FIG. 19 illustrates in circuit diagram form a carry generator of a nineteenth embodiment of the present invention. Carry generator 2000 receives as inputs the $A_0$ bit, the $B_0$ bit, the $A_1$ bit, the $B_1$ bit, the $A_2$ bit, the $B_2$ bit, a block propagate signal from the previous block and a block generate signal from the previous block. Carry generator 2000 generates two signals representing the carry after summing the $A_2$ bit, the $B_2$ bit and all lower bits. The first signal ($c_1$) represents the carry to the fourth bit to generate the fourth of four bits of the sum of two binary numbers when the carry-in signal from the block prior to the previous block is a one. The second signal ($c_0$) represents the carry to the fourth bit to generate the fourth of four bits of the sum of the two binary numbers when the carry-in signal from the block prior to the previous block is a zero. The n channel transistors in series and the n channel transistors in parallel operate similarly as described above. Carry generator 2000 can generate a carry signal after one domino gate delay. Carry generator 2000 can also generate a carry signal with one precharge cycle or with one discharge cycle. In addition, carry generator 2000 employs precharge techniques and active low features as described above. Carry generator 2000 can be utilized as carry generator 1225 of FIG. 12.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a method and apparatus for performing logic operations has been described.

What is claimed is:

1. A logic circuit for performing logic operations comprising:
    a domino logic unit having an output node, said domino logic unit generating a first signal state at said output node in response to a first set of input signals and generating a second signal state at said output node in response to a second set of input signals;
    precharge circuitry coupled to said output node, said precharge circuitry precharging said output node to said second signal state; and
    a bypass switch coupled to said output node, said bypass switch bypassing said domino logic unit in response to said first set of input signals so as to provide a faster switch of said output node from said second signal state to said first signal state.

2. The logic circuit of claim 1 wherein said domino logic circuit comprises:
    a first transistor wherein a gate of said first transistor is coupled to a first input and a drain of said first transistor is coupled to a high voltage potential; and
    a second transistor wherein a gate of said second transistor is coupled to a second input, a drain of said second transistor is coupled to a source of said first transistor and a source of said second transistor is coupled to a low voltage potential.

3. The logic circuit of claim 1 wherein said logic circuit resides in an adder circuit.

4. The logic circuit of claim 3 wherein said domino logic unit comprises a plurality of inputs coupled to a plurality of group propagate signal lines and wherein said output is coupled to a block propagate signal line.

5. The logic circuit of claim 1 wherein said logic circuit further comprises an inverter coupled to said output node, wherein said bypass switch comprises a n type field effect transistor having a gate coupled to an output of said inverter.

6. The logic circuit of claim 5 wherein said bypass switch is activated when said domino logic unit generates a logical-zero signal state.

7. A method for generating an output signal for a logical operation comprising:
    generating a first signal state in response to a first set of input signals;
    generating a second signal state in response to a second set of input signals;
    precharging an output node of a domino logic unit to said second signal state;
    activating a bypass switch in response to said first signal state; and
    bypassing said domino logic unit in response to said first signal state so as to provide a faster switch of said output node from said second signal state to said first signal state.

8. The method of claim 7 wherein said first set of input signals and said second set of input signals are group propagate signals.

9. The method of claim 7 further comprising:

providing said output signal to an adder circuit.

10. A logic circuit for performing logic operations comprising:

means for generating a first signal state in response to a first set of input signals and generating a second signal state in response to a second set of input signals;

means for outputting an output signal coupled to said generating means;

means for precharging said outputting means to said second signal state;

means for bypassing said generating means coupled to said means for outputting an output signal so as to provide a faster switch of said outputting means from said second signal state to said first signal state; and means for controlling said bypassing means.

11. The logic circuit of claim 10 further comprising:

means for receiving a plurality of group propagate signals; and means for outputting a block propagate signal.

12. A computer system comprising:

a bus providing communication links between components in said computer system;

a display device controller coupled to said bus allowing coupling of a display device to said computer system;

external memory coupled to said bus capable of storing information; and a microprocessor coupled to said external memory and said bus having a logic circuit comprising a domino logic unit for generating a first signal state in response to a first set of input signals and generating a second signal state in response to a second set of input signals, an output coupled to said domino logic unit for outputting an output signal, said output precharged to said second signal state, a bypass circuit coupled to said output for bypassing said domino logic unit so as to provide a faster switch of said output node from said second signal state to said first signal state, and a bypass switch coupled to said bypass circuit for controlling said bypass circuit.

13. The computer system of claim 12 wherein said logic circuit resides in an adder circuit.

14. The computer system of claim 13 wherein said domino logic unit comprises a plurality of inputs coupled to a plurality of group propagate signal lines and wherein said output is coupled to a block propagate signal line.

* * * * *

UNITED STATES PATENT AND TRADEMARK OFFICE
CERTIFICATE OF CORRECTION

PATENT NO. : 5,661,675
DATED : August 26, 1997
INVENTOR(S) : Chin et al.

It is certified that error appears in the above-identified patent and that said Letters Patent is hereby corrected as shown below:

In column 1 at line 8 delete "circuit." and insert --circuits.--

In column 1 at line 36 delete "mariner," and insert --manner,--

In column 3 at line 12 delete "10I," and insert --101,--

In column 3 at line 56 delete "fiat" and insert --flat--

In column 5 at line 34 delete "embodiments" and insert --embodiment,--

In column 5 at line 38 delete "dock" and insert --clock--

In column 5 at line 46 delete "dock" and insert --clock--

In column 5 at line 65 delete "dock" and insert --clock--

In column 6 at line 1 delete "dock" and insert --clock--

In column 6 at line 27 delete "dock" and insert --clock--

In column 7 at line 19 delete "dock" and insert --clock--

UNITED STATES PATENT AND TRADEMARK OFFICE
CERTIFICATE OF CORRECTION

PATENT NO. : 5,661,675
DATED : August 26, 1997
INVENTOR(S) : Chin et al.

It is certified that error appears in the above-identified patent and that said Letters Patent is hereby corrected as shown below:

In column 8 at line 14 delete "cart" and insert --can--

In column 9 at line 31 delete "TMs" and insert --This--

In column 10 at line 52 delete "inpt/ts" and insert --inputs--

In column 13 at line 16 delete "Th$_e$" and insert --The--

In column 13 at line 21 delete "stun" and insert --sum--

In column 13 at line 43 delete "1245 gate" and insert --gate 1245--

In column 15 at line 51 delete "dock" and insert --clock--

In column 15 at line 53 delete "dock" and insert --clock--

UNITED STATES PATENT AND TRADEMARK OFFICE
CERTIFICATE OF CORRECTION

PATENT NO. : 5,661,675
DATED : August 26, 1997
INVENTOR(S) : Chin et al.

It is certified that error appears in the above-identified patent and that said Letters Patent is hereby corrected as shown below:

In column 15 at line 54 delete "dock" and insert --clock--

Signed and Sealed this

Twenty-seventh Day of October, 1998

Attest:

BRUCE LEHMAN

*Attesting Officer*     *Commissioner of Patents and Trademarks*